US012527077B2

(12) United States Patent
Kim et al.

(10) Patent No.: US 12,527,077 B2
(45) Date of Patent: Jan. 13, 2026

(54) SEMICONDUCTOR DEVICE AND METHOD FOR FABRICATING THE SAME

(71) Applicant: SAMSUNG ELECTRONICS CO., LTD., Suwon-si (KR)

(72) Inventors: Seung Yoon Kim, Seoul (KR); Jae Ryong Sim, Hwaseong-si (KR); Jee Hoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 693 days.

(21) Appl. No.: 17/334,589

(22) Filed: May 28, 2021

(65) Prior Publication Data

US 2022/0037316 A1 Feb. 3, 2022

(30) Foreign Application Priority Data

Aug. 3, 2020 (KR) .................. 10-2020-0096658
Mar. 29, 2021 (KR) .................. 10-2021-0040399

(51) Int. Cl.
*H10D 84/83* (2025.01)
*H10D 30/62* (2025.01)
(Continued)

(52) U.S. Cl.
CPC ....... *H10D 84/834* (2025.01); *H10D 30/6219* (2025.01); *H10D 84/0149* (2025.01); *H10D 84/0158* (2025.01); *H10D 84/038* (2025.01)

(58) Field of Classification Search
CPC ........... H01L 27/0886; H01L 29/41791; H01L 21/823475
See application file for complete search history.

(56) References Cited

U.S. PATENT DOCUMENTS 7,528,455 B2 * 5/2009 Ahn .................. H01L 29/41758
257/E29.136
7,893,517 B2 * 2/2011 Koyama ............. H01L 29/0847
257/500
(Continued)

FOREIGN PATENT DOCUMENTS

CN 110024134 7/2019
JP 3088203 9/2000
(Continued)

OTHER PUBLICATIONS

European Search Report Dated Jan. 4, 2022 For European Application Serial No. 21 189 475.3-1212.
(Continued)

*Primary Examiner* — Fernando L Toledo
*Assistant Examiner* — Valerie N Newton
(74) *Attorney, Agent, or Firm* — MORGAN, LEWIS & BOCKIUS LLP

(57) ABSTRACT

A semiconductor device includes an active region that extends in a first direction and has a first width in a second direction that intersects the first direction, a first gate structure disposed on the active region that has a second width in the first direction and extends in the second direction, a first metal contact spaced apart from the first gate structure in the first direction, a first trench formed in the active region, and an insulating material that fills the first trench and forms a first active cut, wherein the first active cut defines a first metal region in the active region in which the first metal contact is located, and the first metal contact is placed off-center inside the first metal region and a length of a region where the first gate structure and the active region overlap is greater than that of the first and second trenches.

17 Claims, 36 Drawing Sheets

(51) Int. Cl.
    *H10D 84/01*     (2025.01)
    *H10D 84/03*     (2025.01)

(56) References Cited

U.S. PATENT DOCUMENTS

| | | |
|---|---|---|
| 9,018,707 B2 | 4/2015 | Koo |
| 9,691,472 B2 | 6/2017 | Kang |
| 2006/0006474 A1* | 1/2006 | Tsuboi ................ H01L 27/0207 |
| | | 257/E21.59 |
| 2006/0043500 A1* | 3/2006 | Chen .................. H01L 29/7843 |
| | | 257/369 |
| 2007/0268746 A1 | 11/2007 | Choi et al. |
| 2008/0159882 A1 | 7/2008 | Finkenbinder |
| 2013/0168730 A1 | 7/2013 | Ashida et al. |
| 2014/0339650 A1 | 11/2014 | Smith |
| 2019/0393309 A1 | 12/2019 | Kim |
| 2020/0168720 A1* | 5/2020 | Kwak ................ H01L 21/76832 |
| 2020/0279914 A1* | 9/2020 | Sun ................... H01L 21/76229 |

FOREIGN PATENT DOCUMENTS

| | | |
|---|---|---|
| JP | 4301462 | 7/2009 |
| KR | 100671614 | 1/2007 |
| KR | 20100124576 | 11/2010 |
| KR | 20140023735 | 2/2014 |

OTHER PUBLICATIONS

Office Action dated Apr. 8, 2025 issued in corresponding Japanese Patent Application No. 2021-126212.

\* cited by examiner

SEMICONDUCTOR DEVICE AND METHOD FOR FABRICATING THE SAME

This application claims priority under 35 U.S.C. § 119 from, and the benefit of Korean Patent Application No. 10-2020-0096658 filed on Aug. 3, 2020 and Korean Patent Application No. 10-2021-0040399, filed on Mar. 29, 2021 in the Korean Intellectual Property Office, the contents of both of which are herein incorporated by reference in their entireties.

BACKGROUND

1. Technical Field

Embodiments of the present inventive concept are directed to a semiconductor device and a method for fabricating the same.

2. Discussion of the Related Art

In recent years, as design rules of semiconductor devices have decreased, a gap between a source region and a drain region of a transistor has also become narrower. As doping concentrations of a channel, a source region and a drain region increase, phenomena such as a short channel effect (SCE), a hot carrier effect (HCE), and a GIDL (Gate Induced Drain Leakage) occur, and electrical characteristics of the transistor deteriorate accordingly.

In addition, an effect of low breakdown voltage (BV) occurs in a high-voltage transistor, and there is a need to increase an electrical movement distance between a metal contact and a gate structure.

SUMMARY

Embodiments of the present inventive concept provide a semiconductor device in which breakdown voltage (BV) characteristics are improved, and more specifically, breakdown voltage is increased.

Embodiments of the present inventive concept also provide a method for fabricating a semiconductor device in which the breakdown voltage (BV) characteristics are improved, and more specifically, the breakdown voltage is increased.

According to an embodiment of the present inventive concept, there is provided a semiconductor device that includes an active region that extends in a first direction and has a first width in a second direction that intersects the first direction, a first gate structure disposed on the active region and that includes first and second sides facing each other and that has a second width in the first direction and that extends in the second direction, first and second metal contacts spaced apart from each of the first and second sides of the first gate structure in the first direction, a first trench formed in the active region and that extends in the second direction between the first side of the first gate structure and the first metal contact, and a second trench that extends in the second direction between the second side of the first gate structure and the second metal contact, and an insulating material that fills the first trench and forms a first active cut having a starting point and a termination point spaced from the starting point along the second direction inside the active region, wherein the first active cut defines a first metal region in the active region in which the first metal contact is located, and which is surrounded by a first virtual line that extends from the starting point of the first active cut along the first direction, a second virtual line that extends from the termination point of the first active cut along the first direction, and the insulating material, and a first distance from the first metal contact to the first virtual line is less than a second distance from the first metal contact to the second virtual line, and a length along the first direction of a region in which the first gate structure and the active-region overlap is greater than lengths of the first and second trenches extending in the first direction.

According to an embodiment of the present inventive concept, there is provided a semiconductor device that includes an active region that includes a first region that extends in a first direction and has a first width in a second direction that intersects the first direction, and a second region that extends in the first direction and has a second width in the second direction. The first region includes a first gate structure on the active region that has a third width in the first direction and that extends in the second direction, a first metal contact spaced apart from the first gate structure in the first direction, a first trench formed in the active region, and an insulating material that fills the first trench and forms a first active cut. A first distance in the first direction from the first metal contact to the first active cut differs from a second distance in the first direction from the first metal contact to an end of the first region. The second region includes a second gate structure on the active region that has a fourth width in the first direction and extends in the second direction, and a second metal contact spaced apart from the second gate structure in the first direction.

According to an embodiment of the present inventive concept, there is provided a semiconductor device that includes an active region that extends in a first direction and extends in a second direction that intersects the first direction, a first gate structure disposed on the active region and that extends in the second direction, a first active cut on a first side of the first gate structure and that extends in the second direction from a first side of the active region into the active region, a second active cut on a second side of the first gate structure opposite to the first side of the first gate structure and that extends in an opposite second direction into the active region from a second side of the active region that is opposite to the first side of the active region, wherein each of the first active cut and the second active cut includes a trench filled with an insulating material, and a first metal contact spaced apart from the first active cut in the first direction. A first distance from the first metal contact to the first active cut differs from a second distance from the first metal contact to an end of the active region that is opposite to the first active cut.

According to an embodiment of the present inventive concept, there is provided a method tier fabricating a semiconductor device, including, forming an active region that extends in a first direction and has a first width in a second direction that intersects the first direction, forming a gate structure on the active region, forming a trench in the active region that is spaced apart from the gate structure in the first direction and extends in the second direction, filling the trench with an insulating material and forming an active cut which defines a metal region, and placing a metal contact in the metal region. The metal contact is spaced apart from the active cut in the first direction and is placed off center in the metal region.

DETAILED DESCRIPTION

Figure 1:
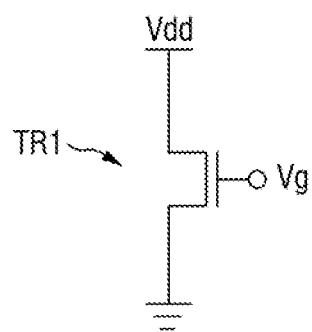
FIG. 1 is a circuit diagram of a semiconductor device according to some embodiments.

Hereinafter, although a fin-type transistor (FinFET) will be described as an example in the drawings of a semiconductor device according to some embodiments, a semiconductor device according to some embodiments is not limited thereto. For example, a semiconductor device according to some embodiments ma include a gate all-around transistor (GAA FET), a tunneling transistor (tunneling FET), a bipolar junction transistor, a lateral diffusion metal oxide semiconductor (LIDMOS), etc., that include some nanowire-shaped or nanosheet-shaped channel regions.

FIG. 1 is a circuit diagram of a semiconductor device according to some embodiments.

Referring to FIG. 1 a semiconductor device I according to some embodiments includes a first transistor TR1.

A source of the first transistor TR1 is connected to a ground voltage, a drain of the first transistor TR1 is connected to a power supply voltage Vdd, and a gate of the first transistor TR1 may be connected to a gate voltage Vg.

When a miniaturized first transistor TR1 uses a high voltage, a breakdown voltage may be reduced. Therefore, it is possible to increase the breakdown voltage of the first transistor TR1 that uses a high voltage, by increasing an electrical distance between the metal contact, such as a drain end of the first transistor TR1 or a source end of the first transistor TR1, and the gate.

A structure that increases an electrical distance between a metal contact, such as a drain or a source end of the first transistor TR1, and the gate of first transistor TR1 in semiconductor device 1 according to some embodiments will be described in detail with reference to FIG. 2.

Figure 2:
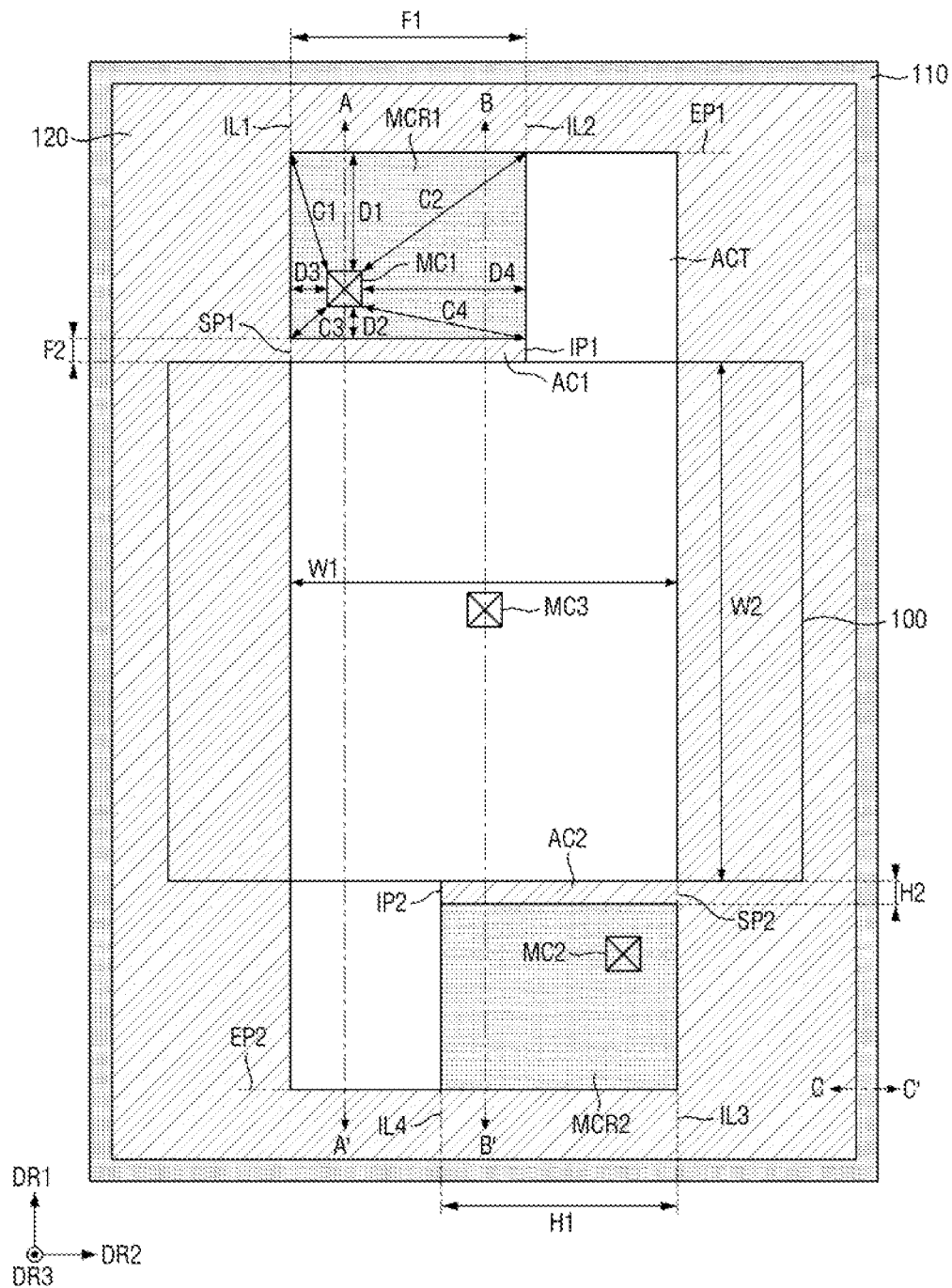
FIG. 2 is a layout diagram of a semiconductor device of FIG. 1 according to some embodiments.

FIG. 2 is a layout diagram of a semiconductor device of FIG. 1 according to some embodiments.

Referring to FIGS. 1 and 2, a structure that increases the electrical distance between the metal contact, such as the drain or source ends of the first transistor TR1, and the gate of the first transistor TR1 will be described with reference to the layout diagram of the first transistor TR1 of the semiconductor device 1 of FIG. 2, according to some embodiments.

According to some embodiments, the first transistor TR1 receives the power supply voltage Vdd through a first metal contact MC1. In addition, the first transistor TR1 receives a ground voltage through a second metal contact MC2. Further, the first transistor TR1 receives the gate voltage Vg through a third metal contact MC3 connected to a gate structure 100. The first metal contact MC1, the second metal contact MC2, and the third metal contact MC3 each have a substantially square shape in the first and second directions DR1 and DR2, although embodiments are not necessarily limited thereto.

The first metal contact MC1, the second metal contact MC2, and the third metal contact MC3 include, for example, a conductive material.

According to some embodiments, the first transistor TR1 extends in a first direction DR1, and is formed on an active region ACT that has a first width W1 in a second direction DR2. The gate structure 100 of the first transistor TR1 has a second width W2 on the active region ACT and extends in the second direction DR2.

According to some embodiments, the first transistor TR1 is surrounded by a shallow trench isolation region (STI) 120 for electrical isolation from other elements. The shallow trench isolation region 120 is formed by filling a trench formed around the first transistor TR1 with an insulating material. The insulating material that forms the shallow trench isolation region 120 includes, for example, at least one of silicon oxide, silicon nitride or silicon oxynitride.

According to some embodiments, the shallow trench isolation region 120 that surrounds the first transistor TR1 is formed by penetrating into the active region ACT. For example, the shallow trench isolation region 120 penetrates into the active region ACT to form a first active cut AC1 or a second active cut AC2, shown in FIGS. 3 and 4. A structure in which the shallow trench isolation region 120 that surrounds the first transistor TR1 penetrates into the active region ACT to form the first active cut AC1 or the second active cut AC2 will be described with reference to FIGS. 3 and 4, which are cross-sectional views taken along a perforated line A-A' and a perforated line B-B' in FIG. 2.

Figure 3:
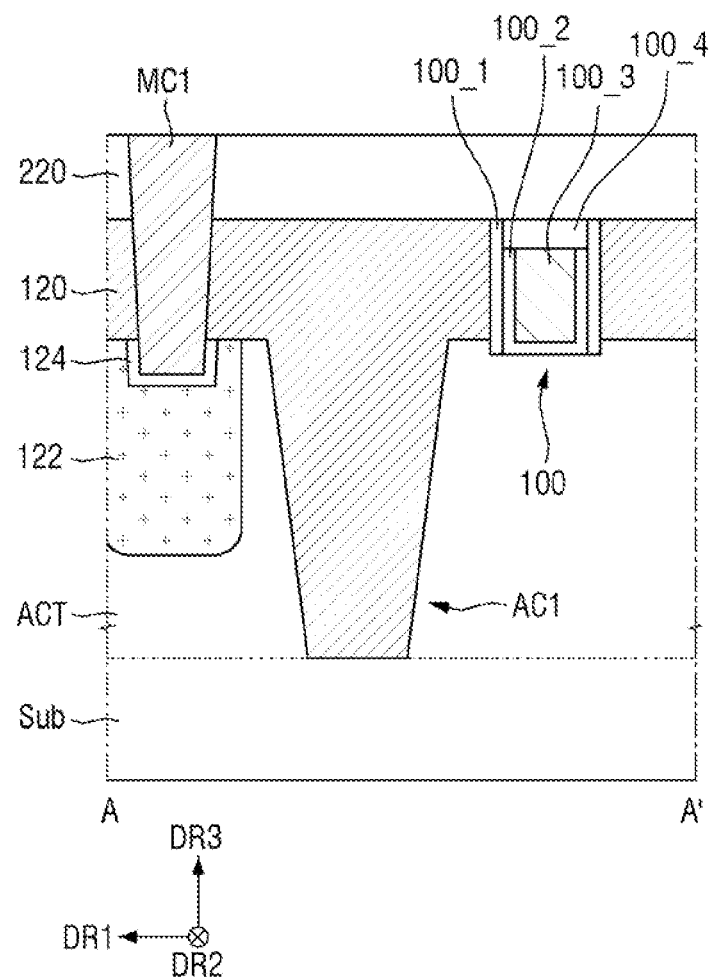
FIG. 3 is a cross-sectional view taken along the line A-A' of FIG. 2.

FIG. 3 is a cross-sectional view taken along the line A-A' of FIG. 2.

Referring to FIGS. 1 to 3, the first transistor TR1 in the semiconductor device 1 according to some embodiments has a fin-type transistor (FinFET) structure.

According to some embodiments, the first transistor TR1 includes the gate structure 100, a source/drain region 122, a silicide layer 124, a first interlayer insulating film 120, a second interlayer insulating film 220 and a first metal contact MC1. In addition, the first transistor TR1 is formed on a substrate Sub and the active region ACT on the substrate Sub. The structure of the first transistor TR1 is not limited thereto, and the first interlayer insulating film 120 may be formed of a material that differs from the material in the first active cut AC1.

According to some embodiments, the substrate Sub may be a silicon substrate or an SOI (silicon-on-insulator). Alternatively, the substrate Sub may include, but is not limited to, silicon germanium, a SGOI (silicon germanium on insulator), indium antimonide, lead tellurium compounds, indium arsenic, indium phosphide, gallium arsenide or gallium antimonide.

According to some embodiments, the active region ACT is where an n-type transistor is formed. The active region ACT may include, for example, a well region doped with p-type impurities. The active region ACT protrudes from the substrate Sub. The active region ACT includes an epitaxial layer that is grown from the substrate Sub.

According to some embodiments, an active cut AC is formed between the first metal contact MC1 of the first transistor TR1 and the gate structure 100. The active cut AC is formed h filling the insulating material 120 in the trench formed between the first metal contact MC1 and the gate structure 100. Since an electrical movement distance between the first metal contact MC1 and the gate structure 100 increases through the active cut AC formed between the first metal contact MC1 and the gate structure 100, a breakdown voltage of the semiconductor device 1, more specifically, a breakdown voltage of the first transistor TR1 may increase.

According to some embodiments, the gate structure 100 according to some embodiments includes a gate spacer 100_1, a gate insulating film 100_2, a gate electrode 100_3, and a capping pattern 100_4. However, a structure of the gate structure 100 is not limited to an embodiment shown in this drawing.

According to some embodiments, the gate spacer 100_1 extends in a third direction DR along both side walls of the gate insulating film 100_2. The gate insulating film 100_2 is placed between the gate electrode 100_3 and the gate spacer 100_1 and below the capping pattern 100_4, and between the gate electrode 100_3 and the active region ACT. The capping pattern 100_4 is placed on each of the gate electrode 100_3 and the gate insulating film 100_2. The gate spacer 100_1 the gate insulating film 100_2, and the capping pattern 100_4 each include an insulating material.

According to some embodiments, the source/drain region 122 is also formed by removing a part of the active region ACT to form a recess and then by filling the recess through epitaxial process. The source/drain region 122 is formed in the active region ACT. The source/drain region 122 is doped with impurities whose conductivity type differs from that of the semiconductor pattern formed in the active region ACT.

According to some embodiments, the first metal contact MC1 applies an electrical signal to the first transistor TR1 in the semiconductor device 1. The silicide layer 124 is placed between the source/drain region 122 and the first metal contact MC1. That is, the first metal contact MC1 is electrically connected to the source/drain region 122 through the silicide layer 124. The first metal contact MC1 is formed in the third direction DR3 and extends in the second direction DR2.

According to some embodiments, the first interlayer insulating film 120 and the second interlayer insulating film 220 surround the first metal contact MC1. Further, the first interlayer insulating film 120 surrounds the gate structure 100. The first interlayer insulating film 120 and the second interlayer insulating film 220 each include an insulating material.

Figure 4:
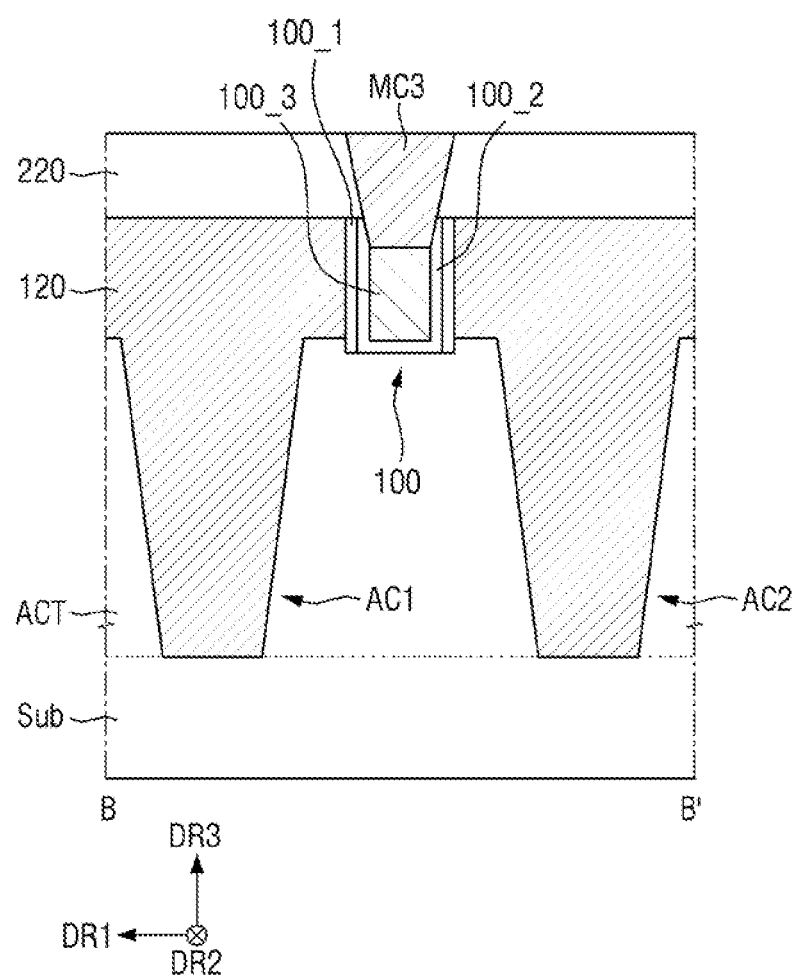
FIG. 4 is a cross-sectional view taken along the line B-B' of FIG. 2.

FIG. 4 is a cross-sectional view taken along the line of FIG. 2.

A description of parts described with reference to FIGS. 1 to 3 will be omitted.

Referring to FIGS. 1, 2 and 4, according to some embodiments, the first active cut AC1 and the second active cut AC2 are formed on both sides of the gate structure 100.

That is, the first gate structure 100 has first and second sides facing each other on the basis of the first direction DR1. In addition, on the basis of the first direction DR1 the first side of the first gate structure 100 and the first metal contact MC1 are spaced apart from each other, and the second side of the first gate structure 100 and the second metal contact MC2 are spaced apart from each other.

The first active cut AC1 and the second active cut AC2 are formed by forming a trench and then filling it with an insulating material. A first trench T1 that is formed by filling the first active cut AC1 with an insulating material extends in a second direction DR2 between the first side of the first gate structure 100 and the first metal contact MC1. In addition, a second trench T2 that is formed by filling, the second active cut AC2 with an insulating material extends in a second direction DR2 between the second side of the first gate structure 100 and the second metal contact MC2.

Accordingly, an electrical distance from the gate structure 100 to the first metal contact MC1 increases through the first active cut AC1, and the breakdown voltage increases accordingly. In addition, an electrical distance from the gate structure 100 to the second metal contact MC2 increases through the second active cut AC2, and the breakdown voltage increases accordingly.

According to some embodiments, the gate electrode 100_3 of the gate structure 100 is electrically connected to the third metal contact MC3 and receives an external signal. The third metal contact MC3 is formed in the third direction DR3 and extends in the second direction DR2.

Referring to FIGS. 1 and 2 again, according to some embodiments, the first active cut AC1 defines a first metal region MCR1 inside the active region ACT in which the first metal contact MC1 is located. The first active cut AC1 is formed by filling an insulating material in the trench inside the active region ACT. The first active cut AC1 extends in the second direction DR2 from a starting point SP1 in the shallow trench isolation region 120 to a termination point IP1. The length and thickness of the first active cut AC1 are not limited to those shown in the drawing.

However, when referring to FIG. 2, a length F2 of the first active cut AC1 extending in the first direction DR1 is less than a length W2 along the first direction DR1 of a region in which the gate structure 100 and the active region ACT overlap. Further, a length F1 of the first active cut AC1 extending in the second direction DR2 is less than a length W1 along the second direction DR2 of the region in which the gate structure 100 and the active region ACT overlap. A length H2 of the second active cut AC2 extending in the first direction DR1 is less than a length W2 along the first direction DR1 of a region in which the gate structure 100 and the active region ACT overlap. Further, a length H1 of the second active cut AC1 extending in the second direction DR2 is less than a length W1 along the second direction DR2 of the region in which the gate structure 100 and the active region ACT overlap. Additionally, when referring to FIG. 2, a length W2 along the first direction DR1 of a region in which the first gate structure 100 and the active region ACT overlap is greater than lengths of the first and second trenches T1, T2 extending in the first direction DR1. In some embodiments, the description of the first trench T1 and the first active cut AC1 also similarly applies to the second trench T2 and the second active cut AC2.

That is, by maximizing the length of the gate structure 100 of the region in which the gate structure 100 and the active region ACT overlap each other, in a transistor structure that maximizes the driving current, the electrical distance between the metal contacts MC1, MC2 and the gate structure 100 may be increased.

The first metal region MCR1 can be defined by a region surrounded by a first virtual line IL1 that extends along the first direction DR1 from the starting point SP1, a second virtual line IL2 that extends along the first direction DR1 from the termination point IP1, the first active cut AC1 and the shallow trench isolation region 120.

According to some embodiments, the first metal contact MC1 is placed off-center inside the first metal region MCR1. A shape in which the first metal contact MC1 is placed off-center inside the first metal region MCR1 will be explained in detail.

According to some embodiments, the first metal contact MC1 is spaced in the first direction DR1 from a termination line EP1 of the first metal region MCR1 by a first distance D1, where the termination line marks an end of the active region. In addition, the first metal contact MC1 is spaced in the first direction DR1 from the first active cut AC1 by a second distance D2. In addition, the first metal contact MC1 is spaced in the second direction DR2 from the first virtual line IL1 by a third distance D3. In addition, the first metal contact MC1 is spaced in the second direction DR2 from the second virtual line IL2 by a fourth distance D4. According to some embodiments, the first distance D1, the second distance D2, the third distance D3, and the fourth distance D4 differ from each other. According to some embodiments, the first distance D1 and the second distance D2 are the same, and the third distance D3 and the fourth distance D4 differ from each other. According to some embodiments, the third distance D3 and the fourth distance D4 are the same, and the first distance D1 and the second distance D2 differ from each other. According to some embodiments, at least one of the four distances, i.e., the first distance D1, the second distance D2, the third distance D3, and the fourth distance D4, differs from other three distances. A relationship among the first to fourth distances D1 to D4 is not limited to any relationship unless they are the same as each other.

Referring to FIG. 2, a third distance D3 from the first metal contact MC1 to the first virtual line IL1 is less than a fourth distance D4 from the first metal contact MC1 to the second virtual line IL2. That is, the yield voltage can be increased by increasing the electrical distance between the metal contacts MC1, MC2 and the gate structure 100.

According to some embodiments, the shape in which the first metal contact MC1 is placed off-center inside the first metal region MCR1 is described differently from the aforementioned description.

According to some embodiments, a first corner of the first metal contact MC1 is spaced in the first and second directions DR1 and DR2 from a point at which the termination line EP1 of the first metal region MCR1 crosses the first virtual line IL, by a first diagonal distance C1. In addition, a second corner of the first metal contact MC1 is spaced in the first direction DR1 and the opposite second direction DR2 from a point at which the termination line EP1 of the first metal region MCR1 crosses the second virtual line IL2 by a second diagonal line C2. In addition, a third corner of the first metal contact MC1 is spaced in the opposite first direction DR1 and the second direction DR2 from a point at which the first virtual line IL1 crosses the first active cut AC1 by a third diagonal distance C3. In addition, a fourth corner of the first metal contact MC1 is spaced in the opposite first direction DR1 and the opposite second direction DR2 from a point at which the second virtual line crosses the first active cut AC1 by a fourth diagonal distance C4. According to some embodiments, the first diagonal distance C1, the second diagonal distance C2, the third diagonal distance C3, and the fourth diagonal distance C4 differ from each other. According to some embodiments, the first diagonal distance C1 and the second diagonal distance C2 are the same, and the third diagonal distance C3 and the fourth diagonal distance C4 differ from each other. According to some embodiments, the third diagonal distance C3 and the fourth diagonal distance C4 are the same, and the first diagonal distance C1 and the second diagonal distance C2 differ from each other. According to some embodiments at least one of the four diagonal distances, the first diagonal distance C1, the second diagonal distance C2, the third diagonal distance C3, and the fourth diagonal distance C4, differs from other three diagonal distances. A relationship among the first to fourth diagonal distances C1 to C4 is not limited to any relationship unless they are the same as each other.

Further, according to some embodiments, a field region 110 surrounds the shallow trench isolation region 120 so that the first transistor TR1, which utilizes a high voltage, is more completely isolated from other elements. The field region 110 is formed by injecting impurities into the bottom of the trench that surrounds the shallow trench isolation region 120 and by filling the trench with an insulating material. A detailed structure of the field region 110 will be described below with reference to a cross section taken along the line C-C', shown in FIG. 5.

Figure 5:
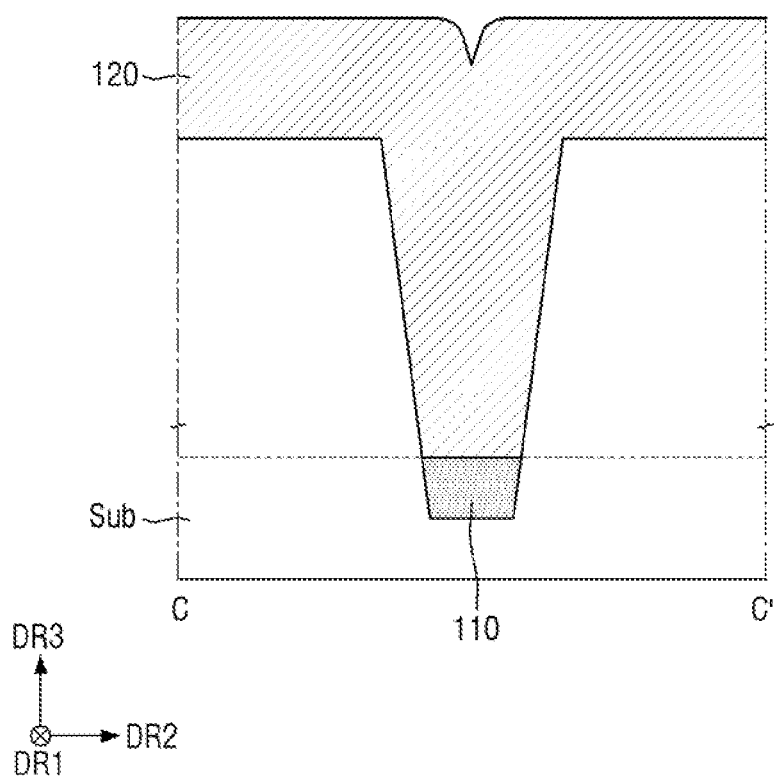
FIG. 5 is a cross-sectional view taken along the line C-C' of FIG. 2.

FIG. 5 is a cross-sectional view taken along the line C-C' of FIG. 2.

Referring to FIGS. 2 and 5, according to some embodiments, impurities 110 are injected into the lower part of the trench to form a field region so that the first transistor TR1 in the semiconductor device 1 is more completely isolated from other elements.

According to some embodiments, when the first transistor TR1 in the semiconductor device 1 is an n-type transistor, the impurities 110 that form the field region include, for example, a triad, such as boron, that is injected to isolate the active region ACT in which a p-well is formed. Alternatively, when the first transistor TR1 in the semiconductor device 1 is a p-type transistor, the impurities 110 that form the field region include, as another example, a pentad, such as phosphorus, that is injected to isolate the active region ACT in which an n-well is formed.

Referring to FIGS. 1 and 2 again, according to some embodiments, the second active cut AC2 defines a second metal region MCR2 inside the active region ACT in which the second metal contact MC2 is located. The second active cut AC2 is formed by filling the trench in the active region ACT with an insulating material. The second active cut AC2 extends in the second direction DR2 from a starting point SP2 in the shallow trench isolation region 120 to a termination point IP2. The length and thickness of the second active cut AC2 are not limited to those shown in this drawing. The second metal region MCR2 can be defined as a region surrounded by a third virtual line IL3 that extends from the starting point SP2 along the first direction DR1, a fourth virtual line IL4 that extends from the termination point IP2 along the first direction DR1, the second active cut AC2 and the shallow trench isolation region 120.

According to some embodiments, the second metal contact MC2 is placed off center inside the second metal region MCR2. Since the description of the off center second metal contact MC2 inside the second metal region MCR2 is similar to the description of the off center first metal contact MC1 inside the first metal region MCR1, a repeated description will be omitted.

A method for fabricating the semiconductor device of FIG. 2 according to some embodiments will be described from an intermediate step through FIGS. 6 to 9 below. In the description of a method for fabricating a semiconductor device, a repeated description of the aforementioned components of the semiconductor device will be omitted.

FIGS. 6 to 9 illustrate intermediate steps of a method for fabricating a semiconductor device of FIG. 2 according to some embodiments.

Figure 6:
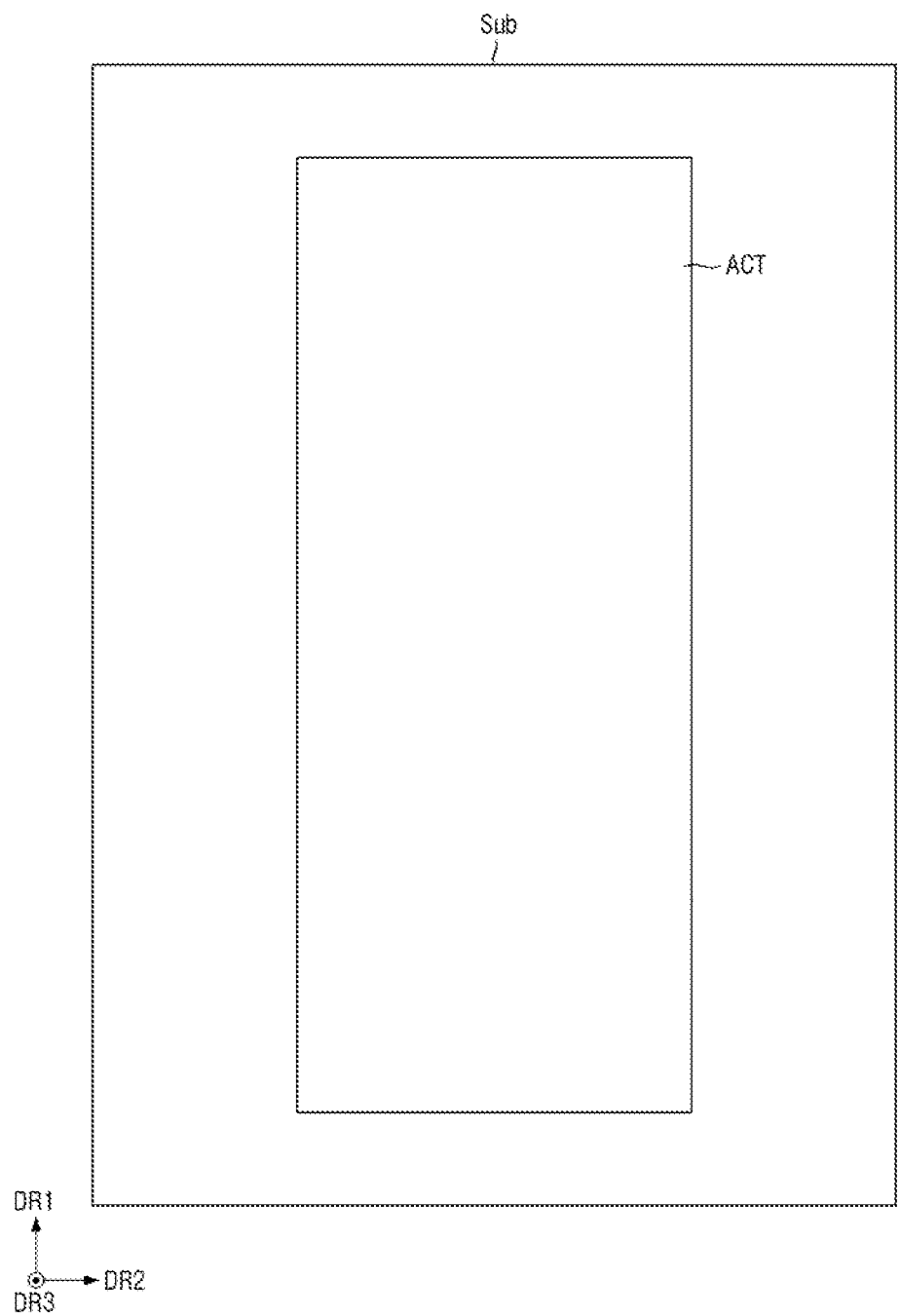
FIGS. 6 to 9 illustrate intermediate steps of a method for fabricating a semiconductor device of FIG. 2 according to some embodiments.

First, according to some embodiments, referring to FIGS. 2 and 6, an active region ACT is formed on the substrate. The active region ACT extends in the first direction DR1 and has a first width W1 in the second direction DR2.

Figure 7:
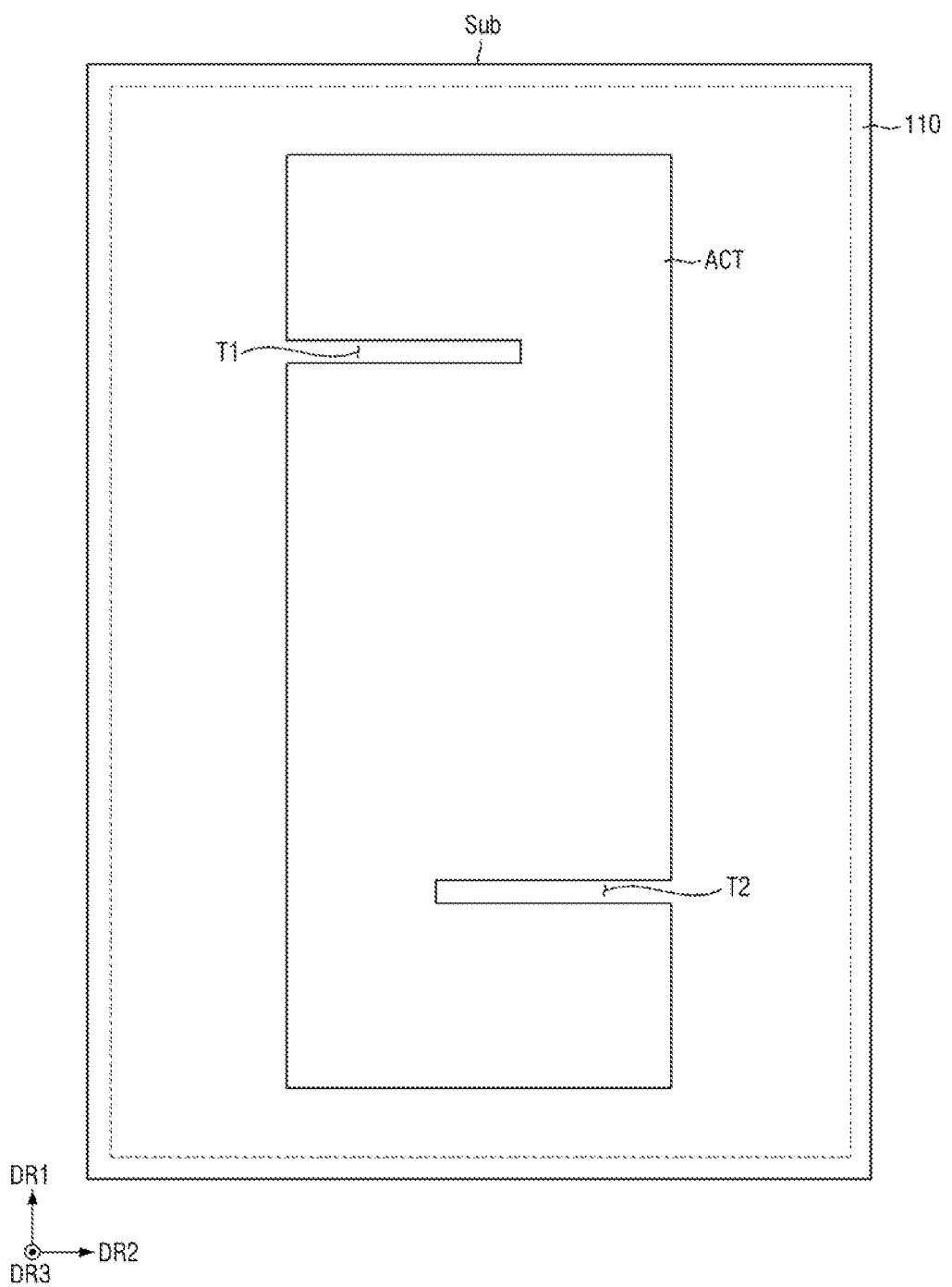

Next, according to some embodiments, referring to FIGS. 2 and 7, a first trench T1 is formed in which the first active cut AC1 will be formed. In addition, a second trench T2 is formed in which the second active cut AC2 will be formed.

Figure 8:
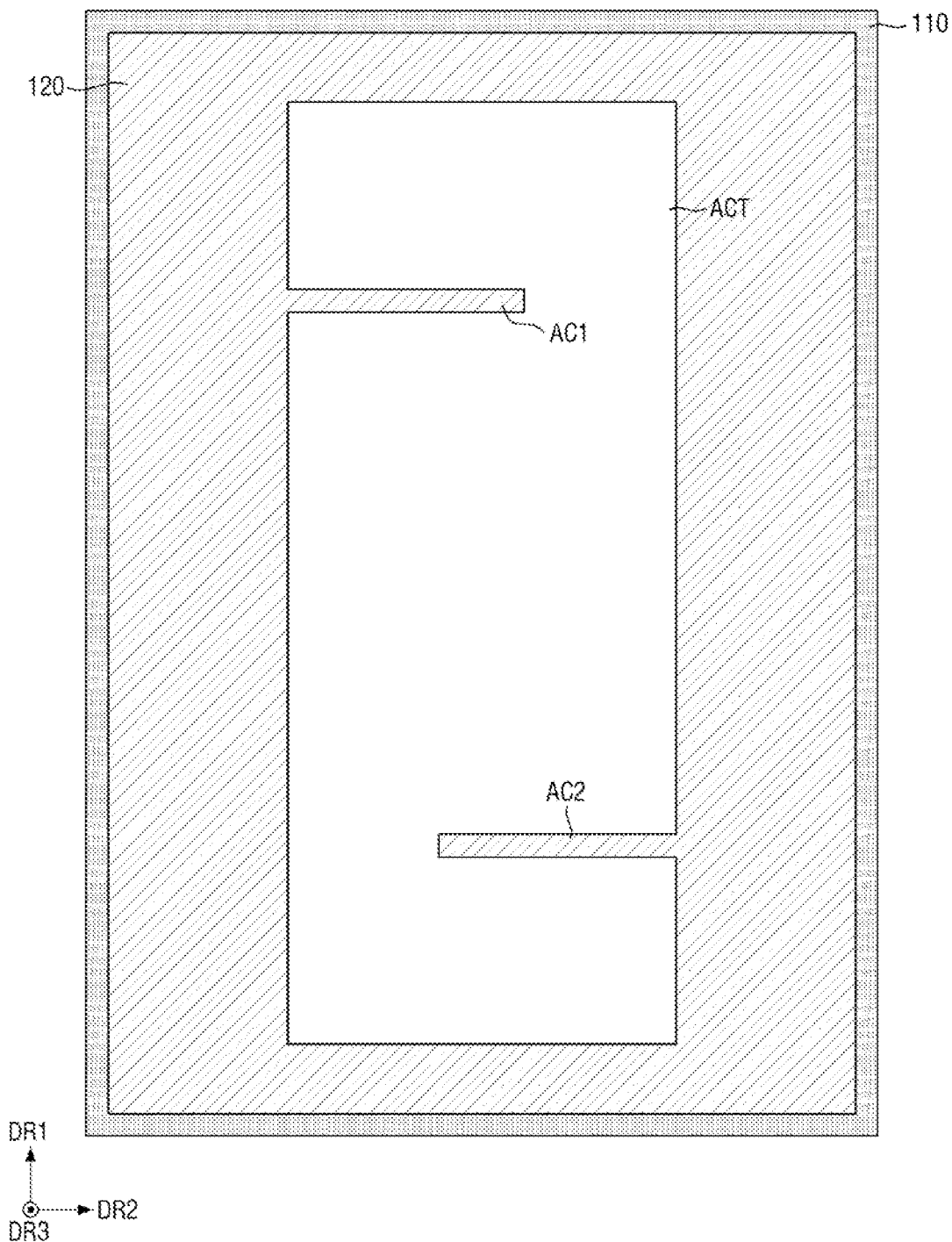

Next, according to some embodiments, referring to FIGS. 2 and 8, by filling the first trench T1, the second trench T2 and the region around the active region ACT with an insulating material, the first active cut AC1, the second active cut AC2 and the shallow trench isolation region 120 are formed. In addition, the field region 110 that surrounds the shallow trench isolation region 120 is formed.

Figure 9:
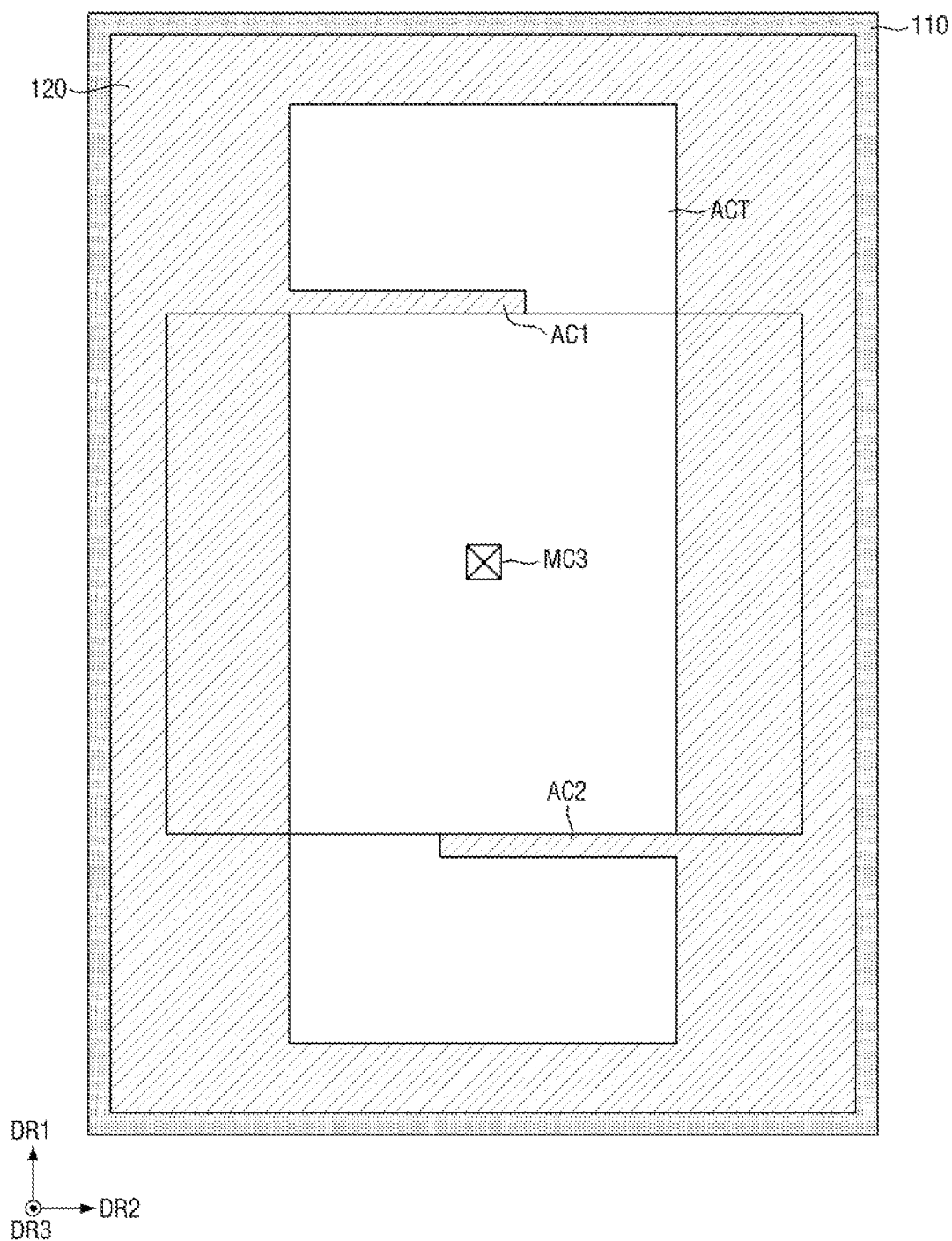

Next, according to some embodiments, referring to FIGS. 2 and 9, a gate structure 100 that extends in the second direction DR2 and has a second width W2 in the first direction DR1 is formed on the active region ACT. After that, a third metal contact MC3 is formed so that the gate structure 100 can receive an external electrical signal.

After that, according to some embodiments, a first metal contact MC1 is formed off-center in the first metal region MCR1 defined h the first active cut AC1. In addition, a second metal contact MC2 is formed off center in the second metal region MCR2 defined by the second active cut AC2. As a result, a transistor in a semiconductor device of FIG. 2 is formed.

Hereinafter, a repeated description of aforementioned components will be omitted, and differences will be mainly described.

Figure 11:
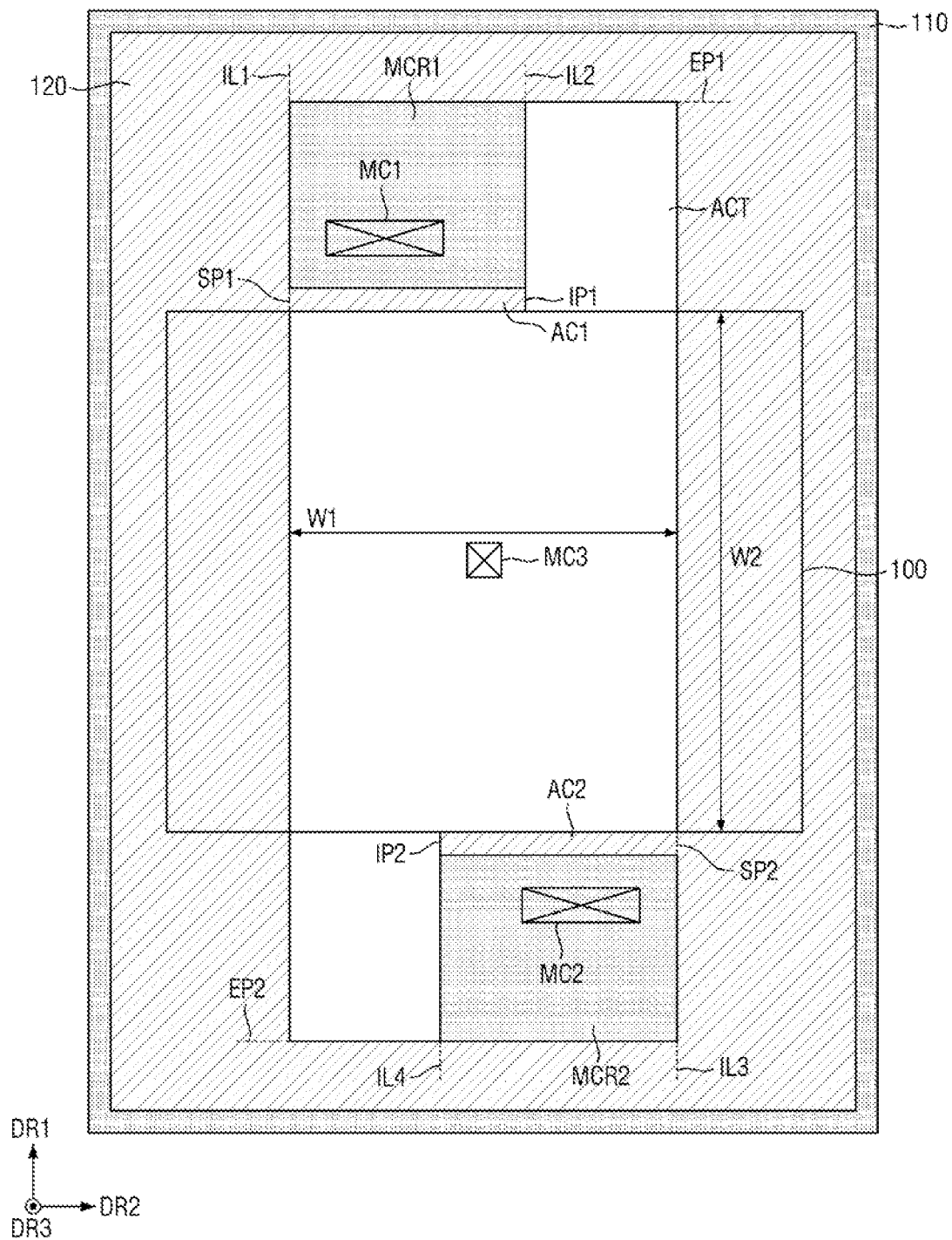
Figure 30:
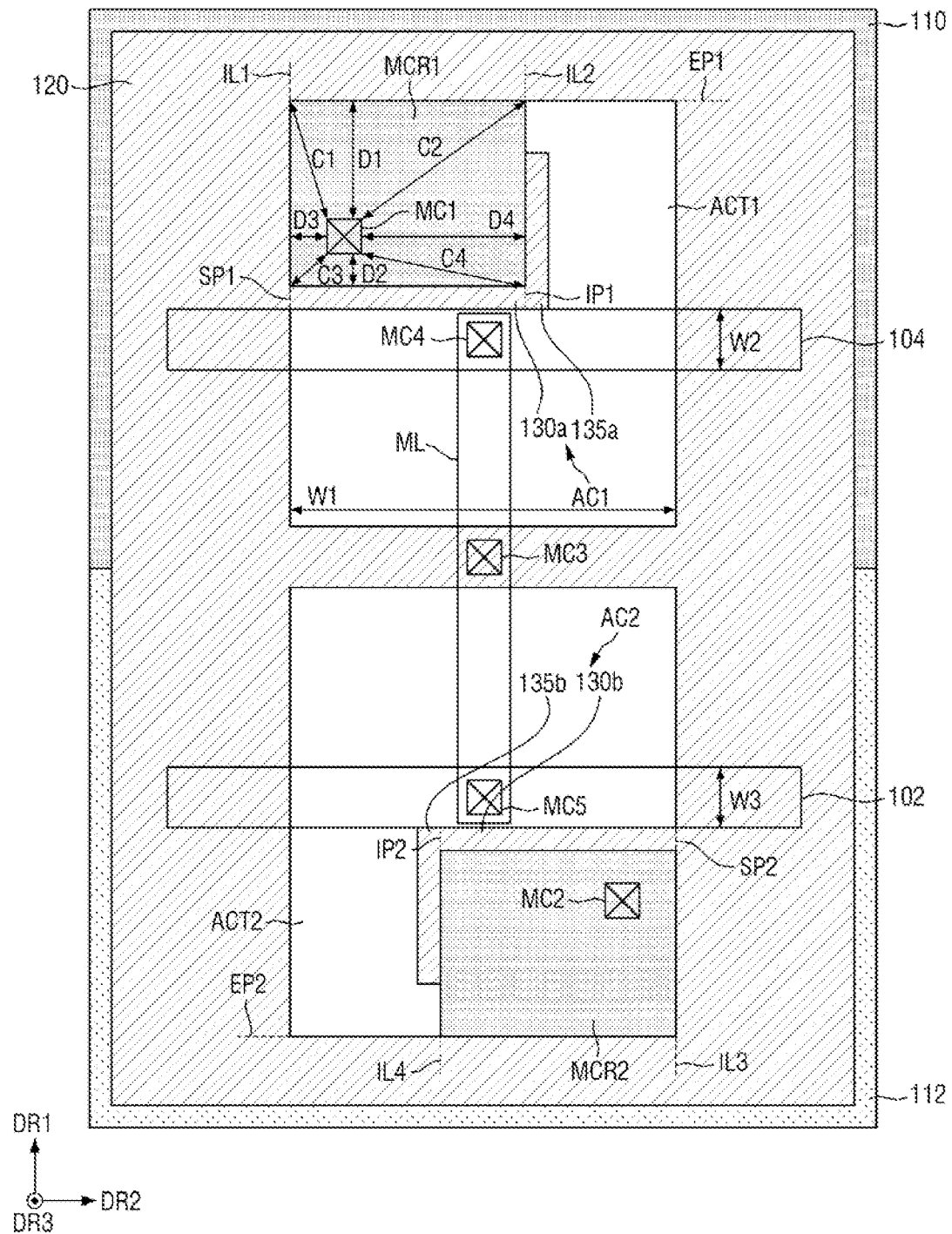
FIGS. 30 to 36 are layout diagrams of another semiconductor device according to some embodiments.
Figure 31:
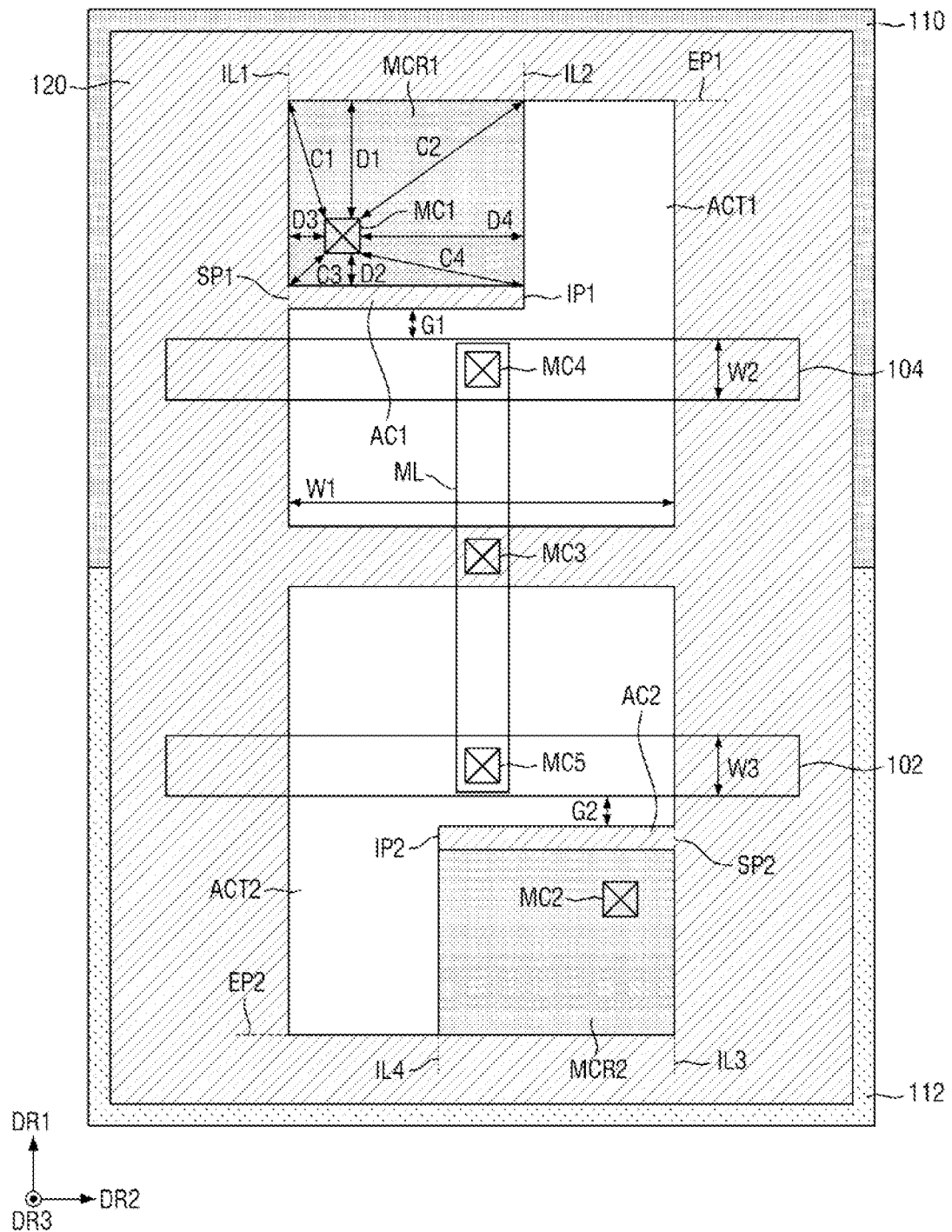
Figure 32:
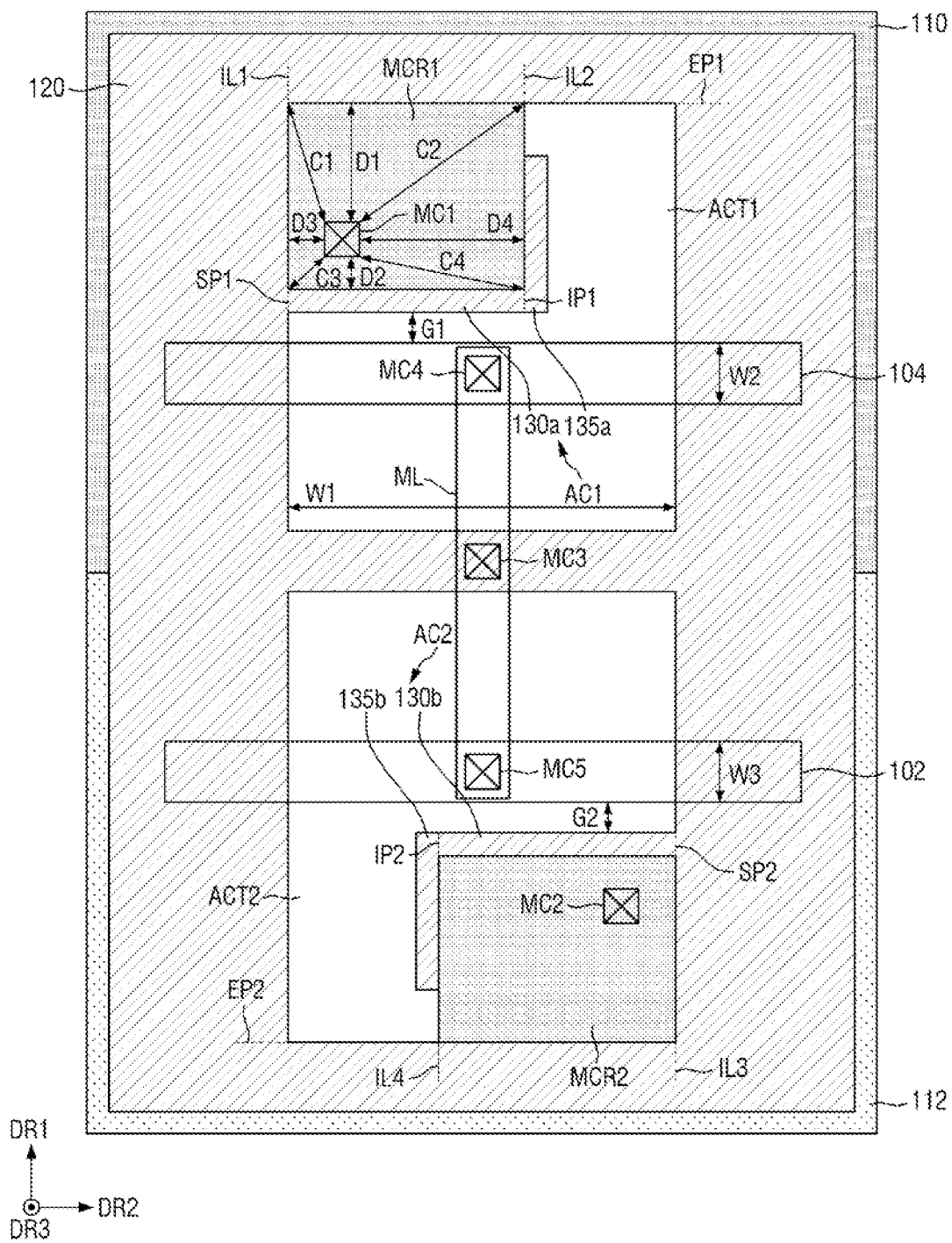
Figure 33:
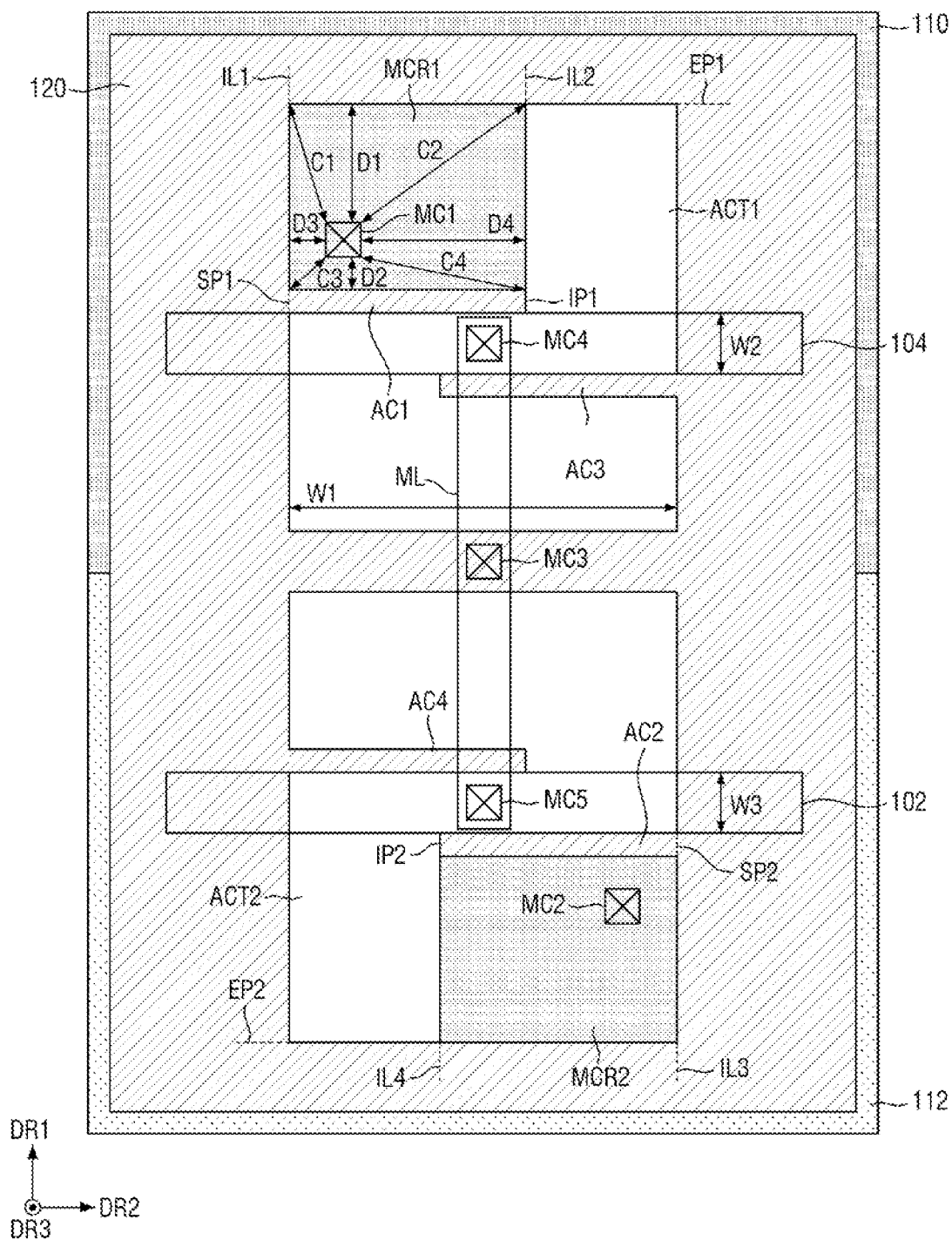
Figure 34:
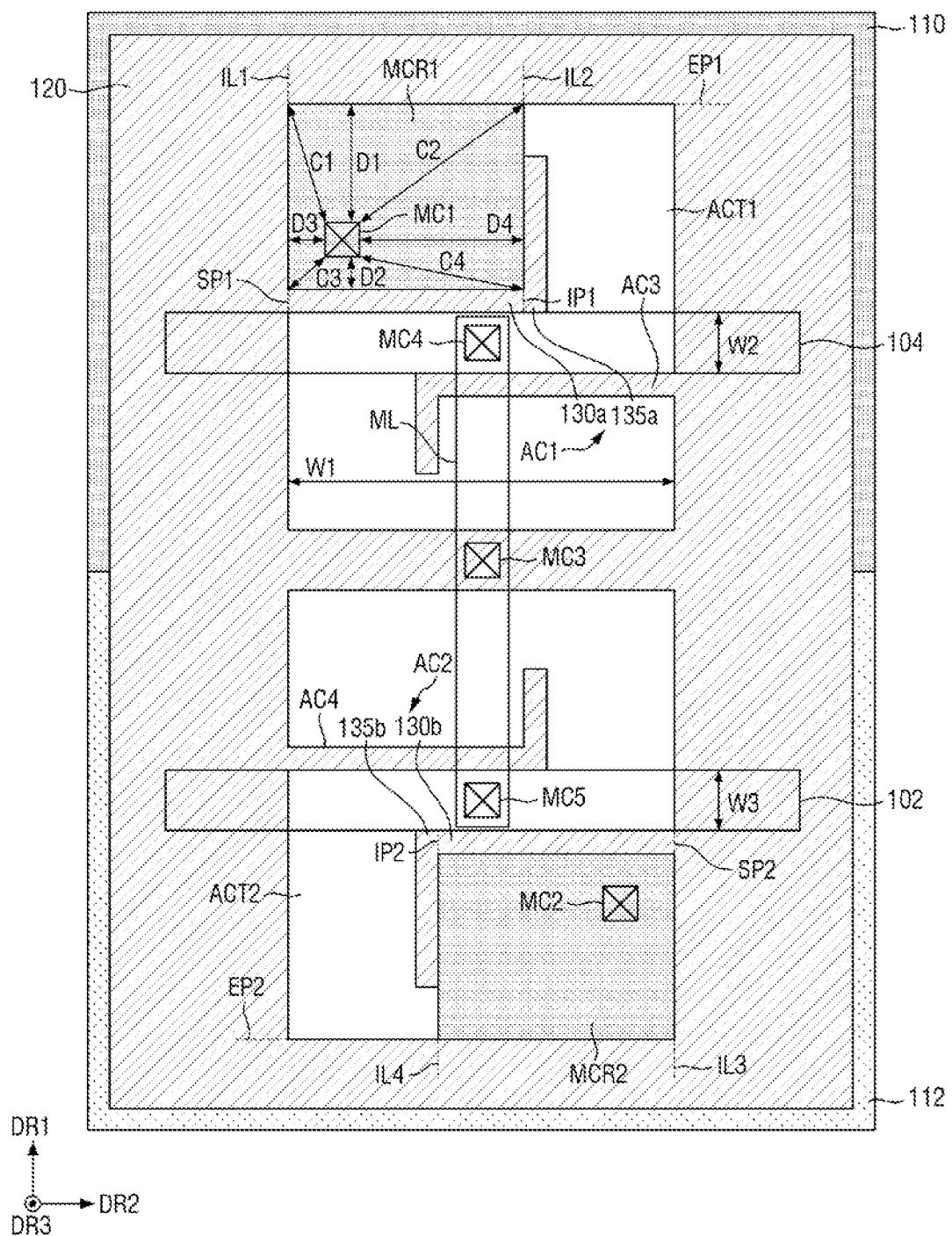
Figure 35:
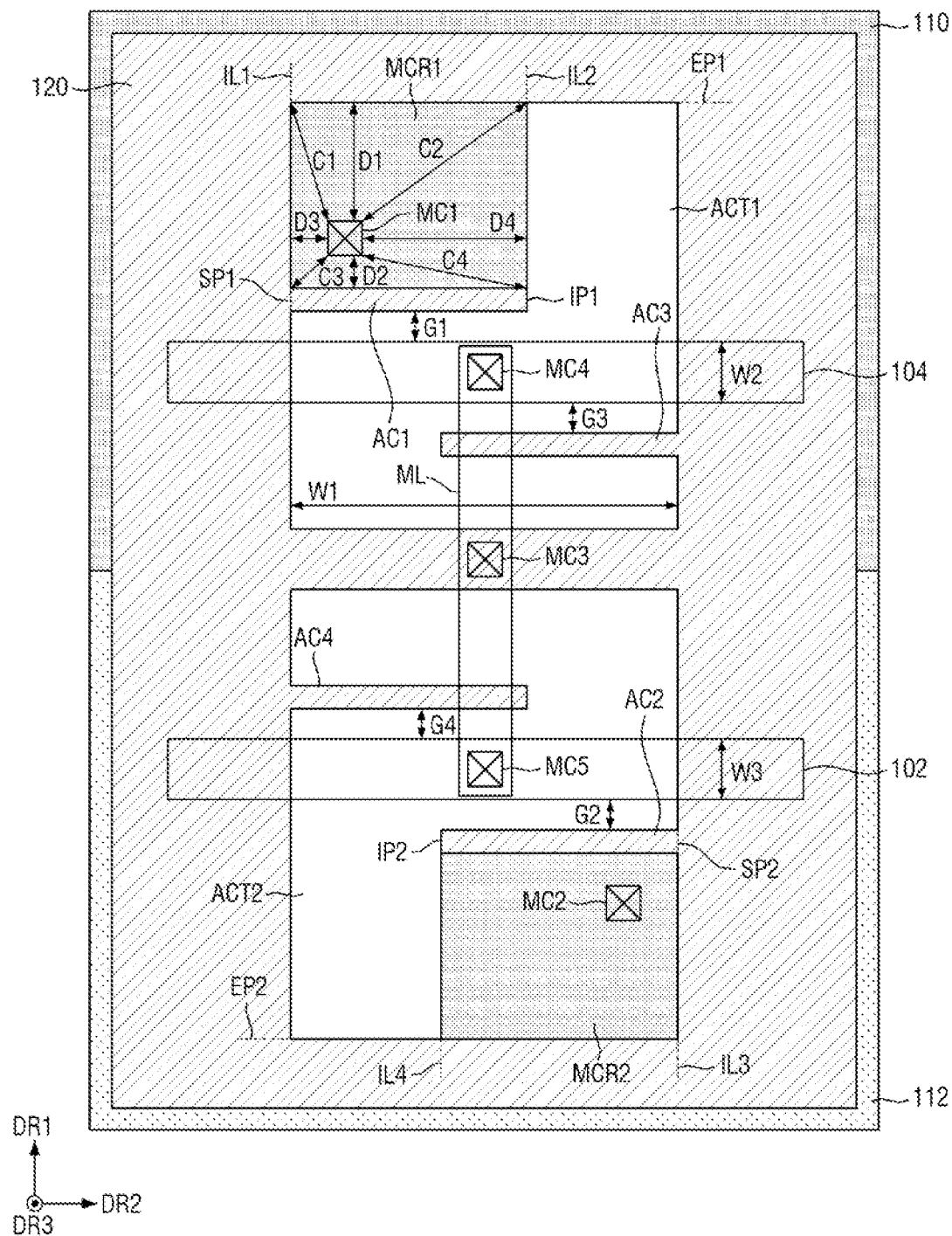
Figure 36:
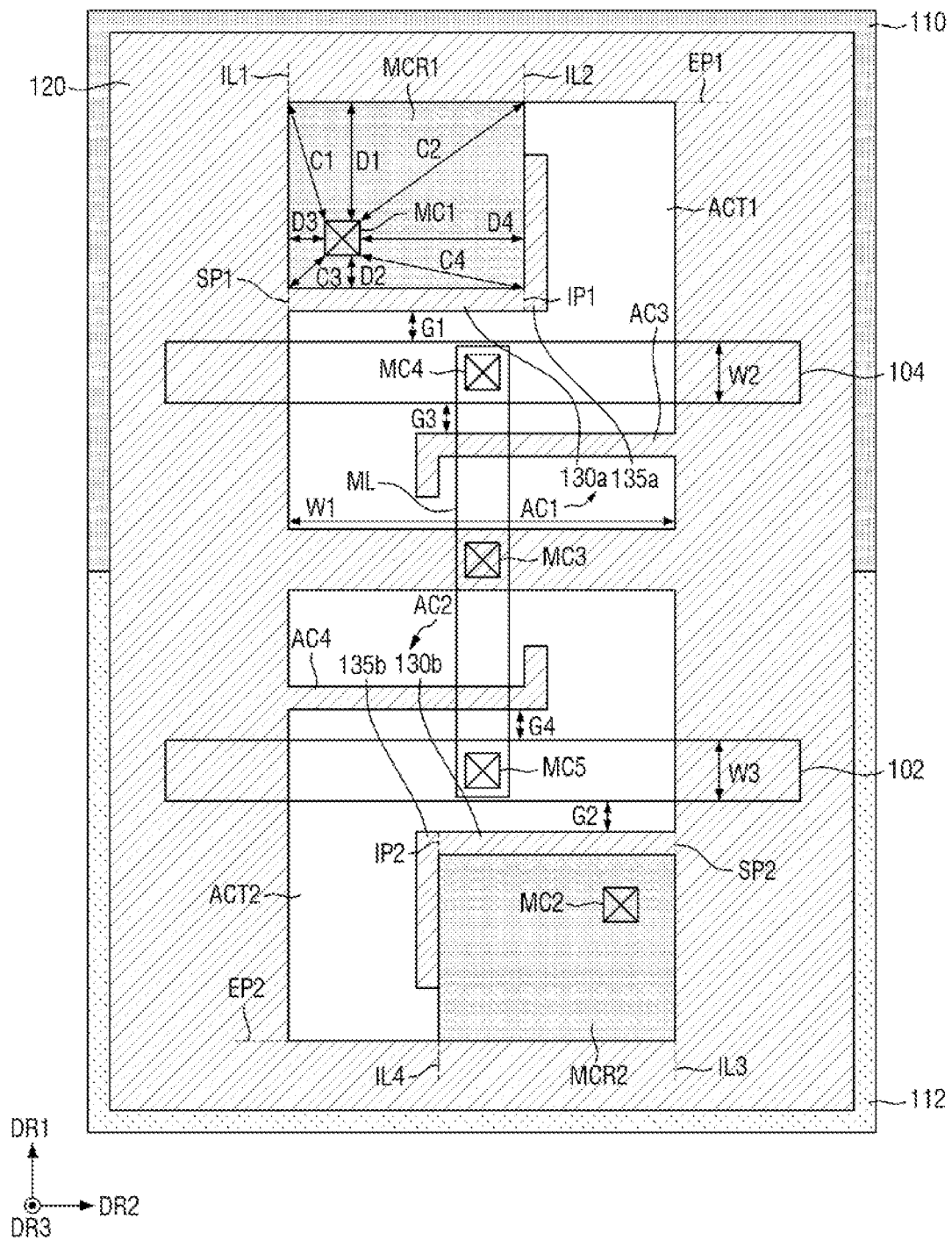

FIGS. 30 and 11 are layout diagrams of a semiconductor device that differs from a semiconductor device of FIG. 2, according to some embodiments.

Figure 10:
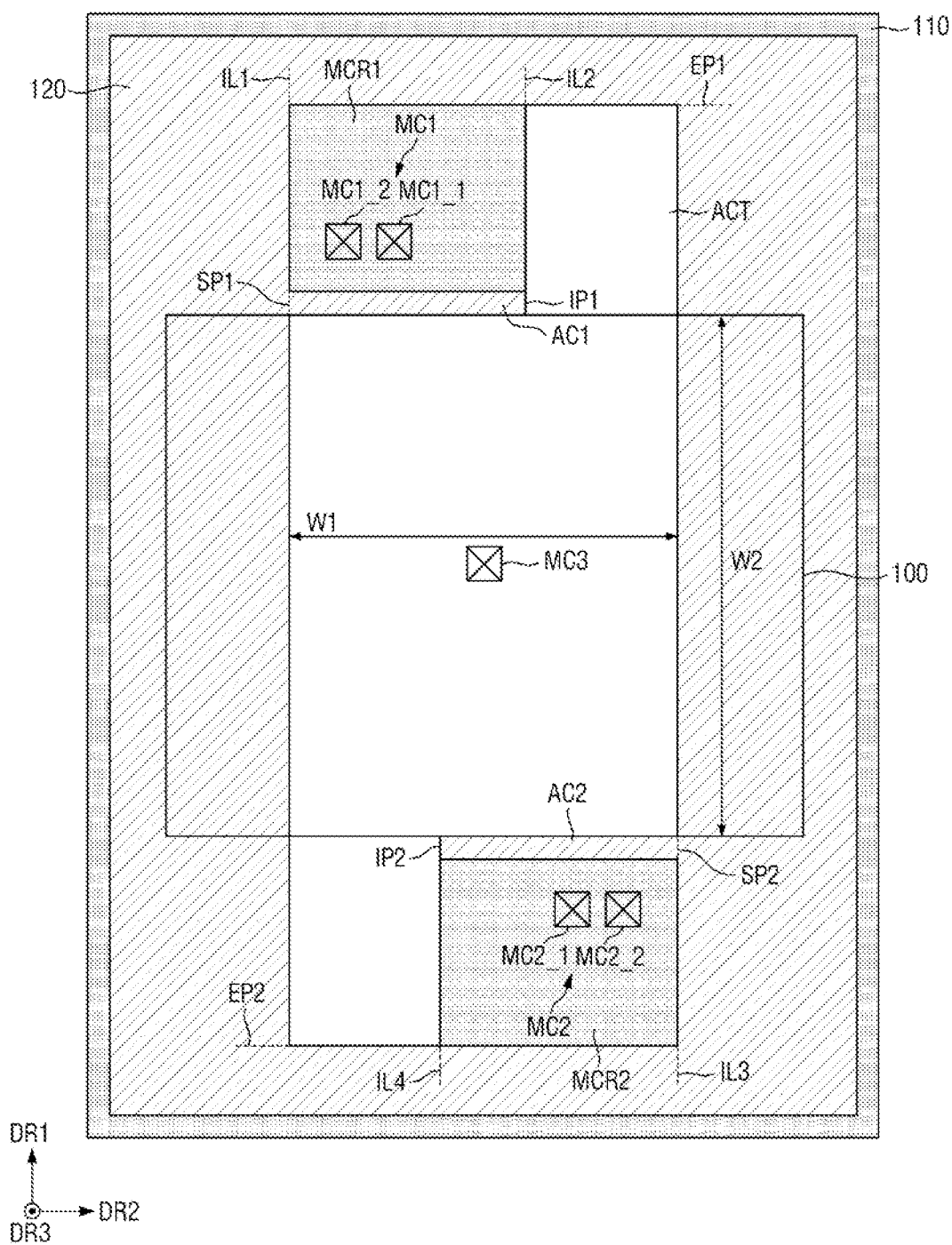
FIGS. 10 and 11 are layout diagrams of a semiconductor device that differs from a semiconductor device of FIG. 2 according to some embodiments.

Referring to FIG. 10, according to some embodiments, a semiconductor device of FIG. 10 includes a metal contact whose form differs from a metal contact of a semiconductor device of FIG. 2.

In detail, according to some embodiments, the first metal contact MC1 includes a plurality of sub-metal contacts, such as a first first metal contact MC1_1 and a first second metal contact MC1_2. Further, the second metal contact MC2 includes a plurality of sub-metal contacts, such as a second first metal contact MC2_1 and a second second metal contact MC2_2.

According to some embodiments, the number and arrangement of the plurality of sub-metal contacts in the first metal contact MC1 are not limited to those shown in FIG. 10. Further, the number and arrangement of the plurality of sub-metal contacts in the second metal contact MC2 are not limited to those shown in FIG. 10.

According to sonic embodiments, referring to FIG. 11, a semiconductor device of FIG. 11 includes a metal contact whose form differs from that of the metal contact of a semiconductor device of FIG. 2.

In detail, according to some embodiments, the first metal contact MC1 has a bar shape that extends in the second direction DR2. In addition, the second metal contact MC2 also has a bar shape that extends in the second direction DR2.

The length and shape of the bar-shaped first metal contact MC1 and the bar-shaped second metal contact MC2 are not limited thereto.

Figure 12:
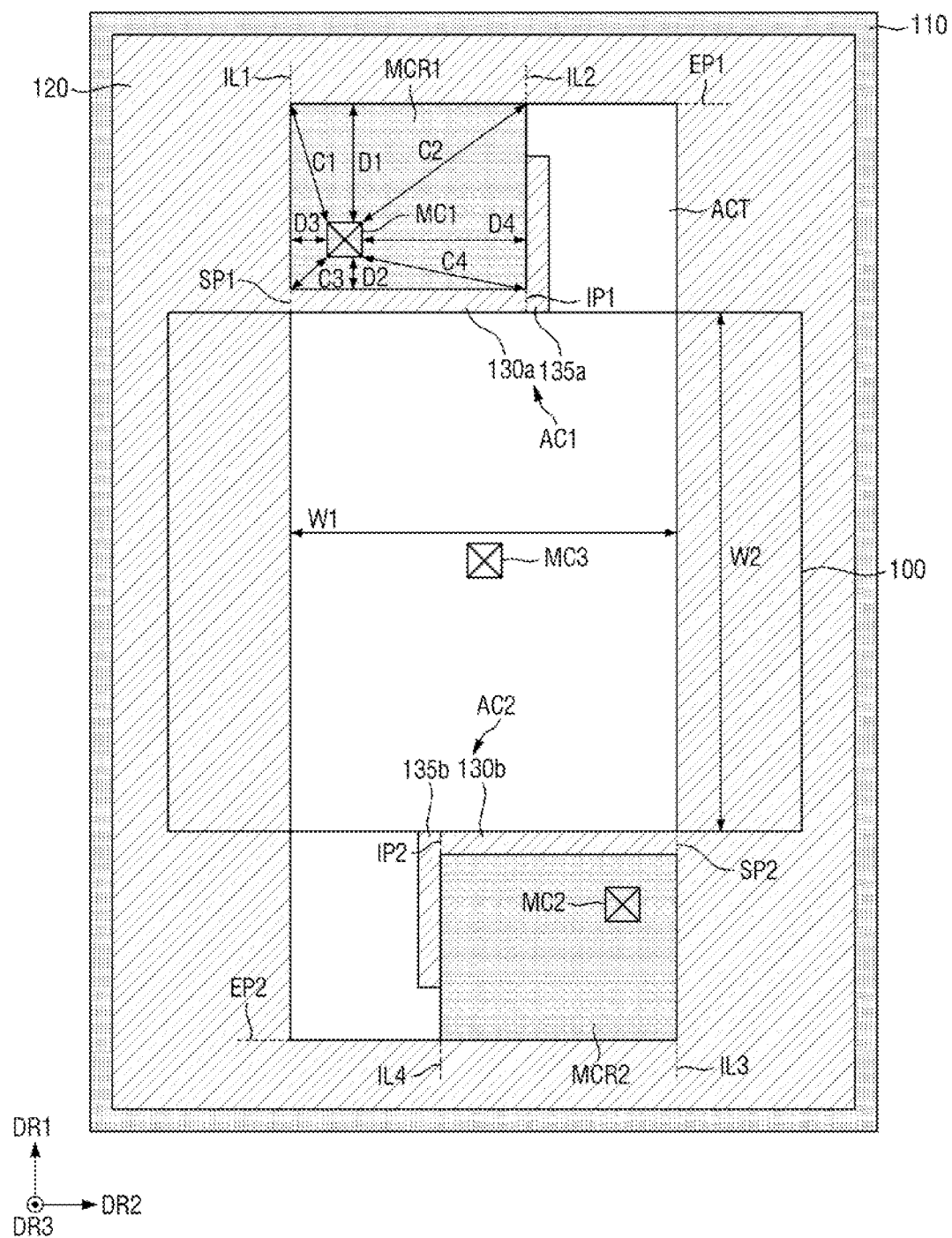
FIGS. 12 to 14 are layout diagrams of another semiconductor device according to some embodiments.
Figure 13:
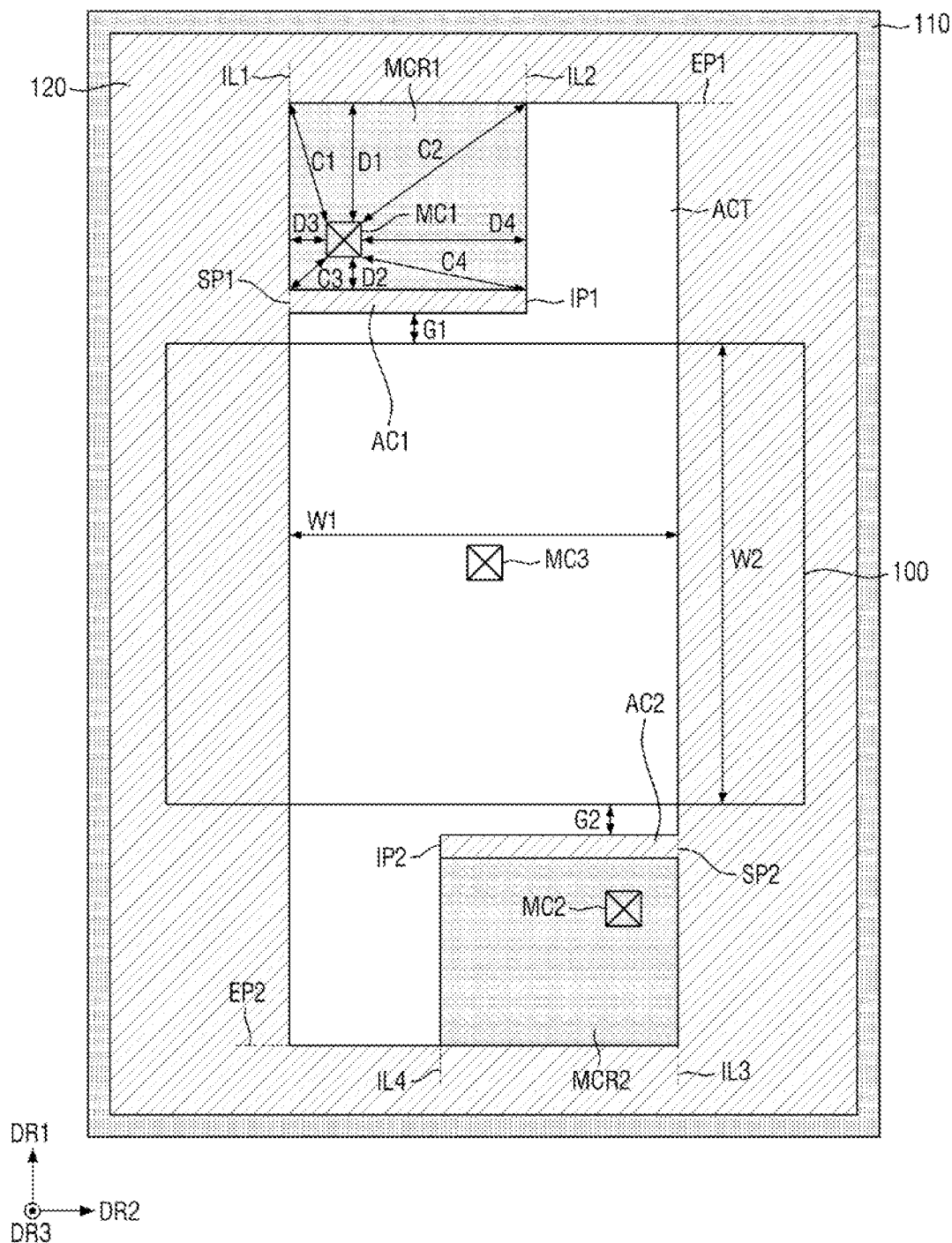
Figure 14:
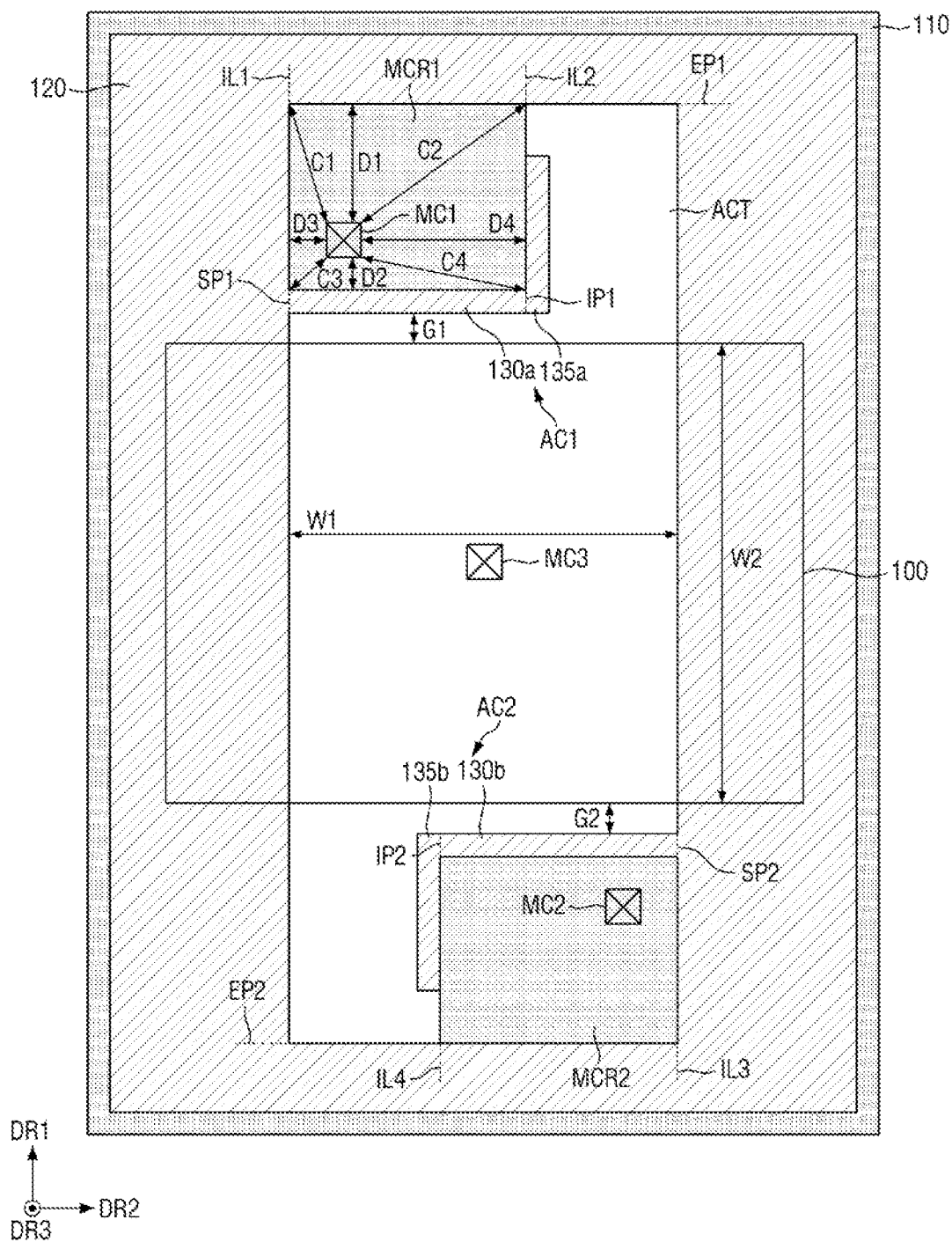

FIGS. 12 to 14 are layout diagrams of another semiconductor device according to some embodiments.

Referring to FIG. 12, according to some embodiments, unlike a semiconductor device of FIG. 2 the first active cut AC1 includes a first extension 130a and a first protrusion 135a. The first protrusion 135a extends away from the gate structure 100 in the first direction DR1, substantially perpendicular to the extension direction of the first extension 130a. That is, the first extension 130a is the same as the first active cut AC1 of FIG. 2, and a semiconductor device of FIG. 12 further includes a first protrusion 135a.

In a semiconductor device of FIG. 12 according to some embodiments, by further including the first protrusion 135a, the electrical movement distance between the first metal contact MC1 and the gate structure 100 further increases, and the breakdown voltage of a semiconductor device of FIG. 12 increases accordingly.

Further, according to some embodiments, unlike a semiconductor device of FIG. 2, in a semiconductor device of FIG. 12, the second active cut AC2 includes a second extension 130b and a second protrusion 135b. The second protrusion 135b extends away from the gate structure 100 in the first direction DR1, substantially perpendicular to the extension direction of the second extension 130b. That is, the second extension 130b is the same as the second active cut AC2 in FIG. 2, and a semiconductor device of FIG. 12 further includes the second protrusion 135b.

In a semiconductor device of FIG. 12 according to some embodiments, by further including the second protrusion 135b, the electrical movement distance between the second metal contact MC2 and the gate structure 100 further increases, and the breakdown voltage of a semiconductor device of FIG. 12 increases accordingly.

Referring to FIG. 13, unlike a semiconductor device of FIG. 2 according to some embodiments, the first active cut AC1 is spaced apart in the first direction DR1 by a first gap G1 from the gate structure 100.

That is, according to some embodiments, in a semiconductor device of FIG. 13, since the first active cut AC1 is spaced apart from the gate structure 100 in the first direction DR1 by the first gap G1, the electrical movement distance between the first metal contact MC1 and the gate structure 100 further increases, and the breakdown voltage of a semiconductor device of FIG. 13 increases accordingly.

Further, according to some embodiments, unlike a semiconductor device of FIG. 2, in a semiconductor device of FIG. 13, the second active cut AC2 is spaced apart in the first direction DR1 by a second gap G2 from the gate structure 100.

That is, according to some embodiments, in a semiconductor device of FIG. 13, since the second active cut AC2 is spaced apart from the gate structure 100 in the first direction DR1 by the second gap G2, the electrical movement distance between the second metal contact MC2 and the gate structure 100 further increases, and the breakdown voltage of the semiconductor device of FIG. 13 increases accordingly.

The first gap G1 and the second gap G2 may be the same or may differ from each other.

Referring to FIG. 14, according to some embodiments, unlike a semiconductor device of FIG. 12, the first active cut AC1 is spaced apart in the first direction DR1 by the first gap G1 from the gate structure 100.

That is, according to some embodiments, in a semiconductor device of FIG. 14, since the first active cut AC1 is spaced apart from the gate structure 100 in the first direction DR1 by the first gap G1, the electrical movement distance between the first metal contact MC1 and the gate structure 100 further increases, and the breakdown voltage of a semiconductor device of FIG. 14 increases accordingly.

Further, according to some embodiments, unlike a semiconductor device of FIG. 12, in a semiconductor device of FIG. 14, the second active cut AC2 is spaced apart in the first direction DR1 by a second gap G2 from the gate structure 100.

That is, according to some embodiments, in a semiconductor device of FIG. 14, since the second active cut AC2 is spaced apart from the gate structure 100 in the first direction DR1 by the second gap G2, the electrical movement distance between the second metal contact MC2 and the gate structure 100 further increases, and the breakdown voltage of a semiconductor device of FIG. 14 increases accordingly.

Figure 15:
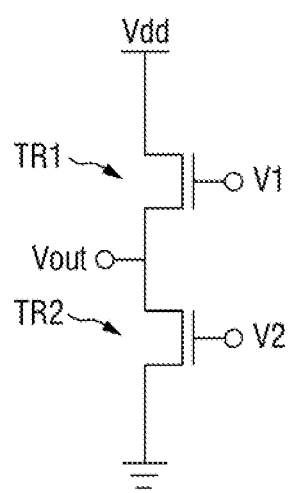
FIG. 15 is a circuit diagram of another semiconductor device according to some embodiments.

FIG. 15 is a circuit diagram of a semiconductor device according to some embodiments.

Referring to FIG. 15, according to some embodiments, a semiconductor device 2 includes a first transistor TR1 and a second transistor TR2. For example, a semiconductor device 2 includes a source follower circuit to which a current source load is connected.

According to some embodiments, a source of the first transistor TR1 is connected to a drain of the second transistor TR2, a drain of the first transistor TR1 is connected to a power supply voltage Vdd, and a gate of the first transistor TR1 may be connected to the gate voltage V1, such as an input voltage.

Further, according to some embodiments, a drain of the second transistor TR2 is connected to a source of the first transistor TR1, a source of the second transistor TR2 is connected to a ground voltage, and a gate of the second transistor TR2 is connected to another gate voltage V2.

A semiconductor device 2 according to some embodiments generates an output voltage Vout through a node at which the source end of the first transistor TR1 and the drain end of the second transistor TR2 are connected.

With a miniaturization of the first transistor TR1 and the second transistor TR2, which both utilize a high voltage, a breakdown voltage decreases. Thus, by increasing the electrical distance between a metal contact, such as the drain of the first transistor TR1, the source end of the first transistor TR1, the drain end of the second transistor TR2 or the source end of the second transistor TR2, and the gate, it is possible to increase the breakdown voltage of the first transistor TR1 and the second transistor TR2.

According to some embodiments, a structure which increases the electrical distance between a metal contact, such as the drain end of first transistor TR1 or the source end of first transistor TR1, and the gate of the first transistor TR1 in the semiconductor device 2 has been described in detail with reference to FIG. 2. Further, a structure which increases the electrical distance between a metal contact, such as the drain end of the second transistor TR2 or the source end of the second transistor TR2, and the gate of the second transistor TR2 in the semiconductor device 2 has been described in detail with reference to FIG. 2. A repeated description of aforementioned components will be omitted.

Figure 16:
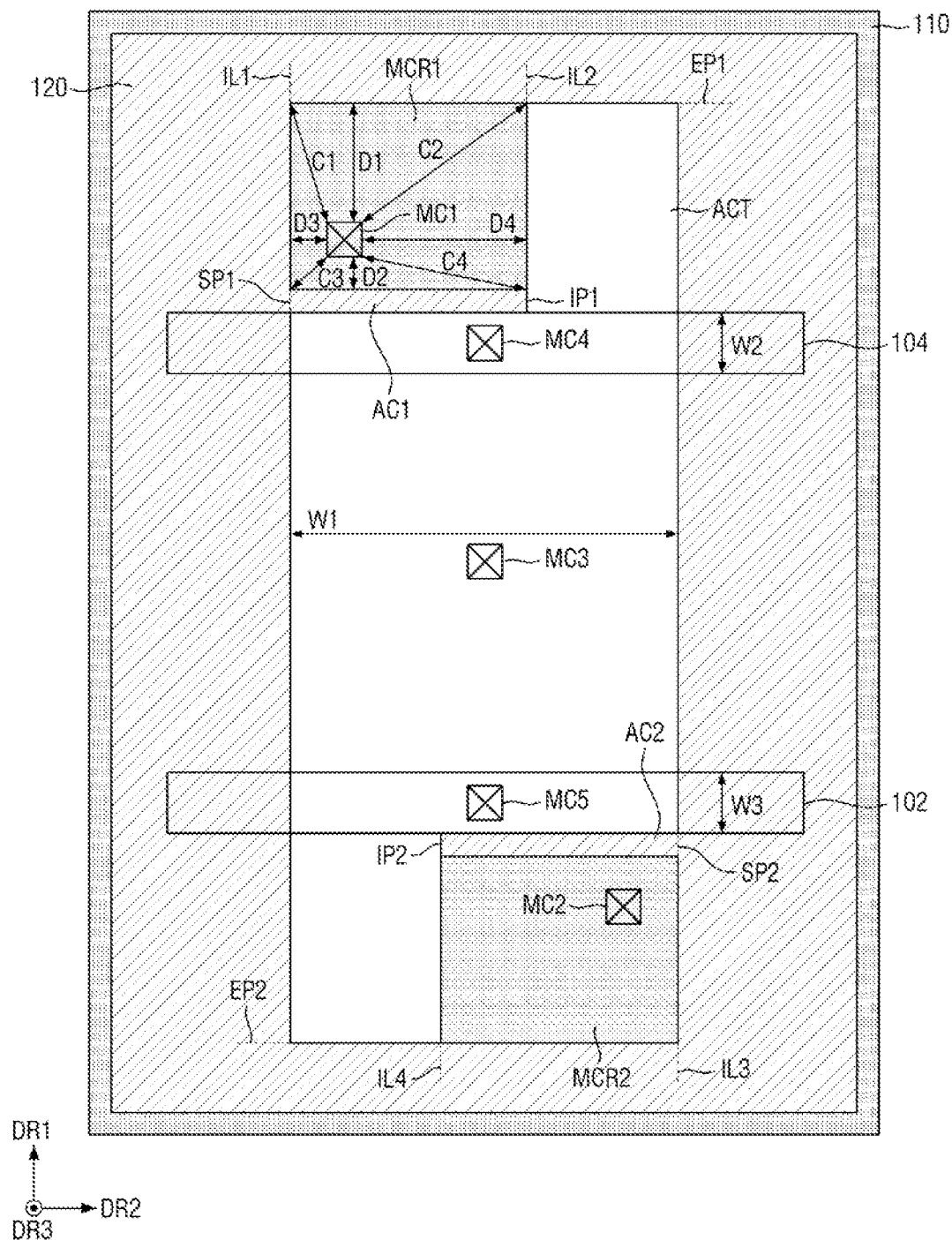
FIG. 16 is a layout diagram of a semiconductor device of FIG. 15 according to some embodiments.

FIG. 16 is a layout diagram of a semiconductor device of FIG. 15 according to some embodiments.

Referring to FIGS. 15 and 16, according to some embodiments, unlike a semiconductor device of FIG. 2, a semiconductor device of FIG. 16 includes a first gate structure 102 and a second gate structure 104.

According to some embodiments, the first gate structure 102 has a second width W2, and the second gate structure 104 has a third width W3. The second width W2 and the third width W3 may be the same as or different from each other.

According to some embodiments, the first metal contact MC1 receives the power supply voltage Vdd applied to the drain end of the first transistor TR1, a fourth metal contact MC4 receives the gate voltage V1 applied to the gate end of the first transistor TR1, a fifth metal contact MC5 receives another gate voltage V2 applied to the gate end of the second transistor TR2, and the second metal contact MC2 receives the ground voltage applied to the source end of the second transistor TR2. Further, the third metal contact MC3 is formed between the first gate structure 102 and the second gate structure 104, and connects the source end of the first transistor TR1 and the drain end of the second transistor TR2. That is, the output voltage Vout may be generated and output through the third metal contact MC3.

Figure 17:
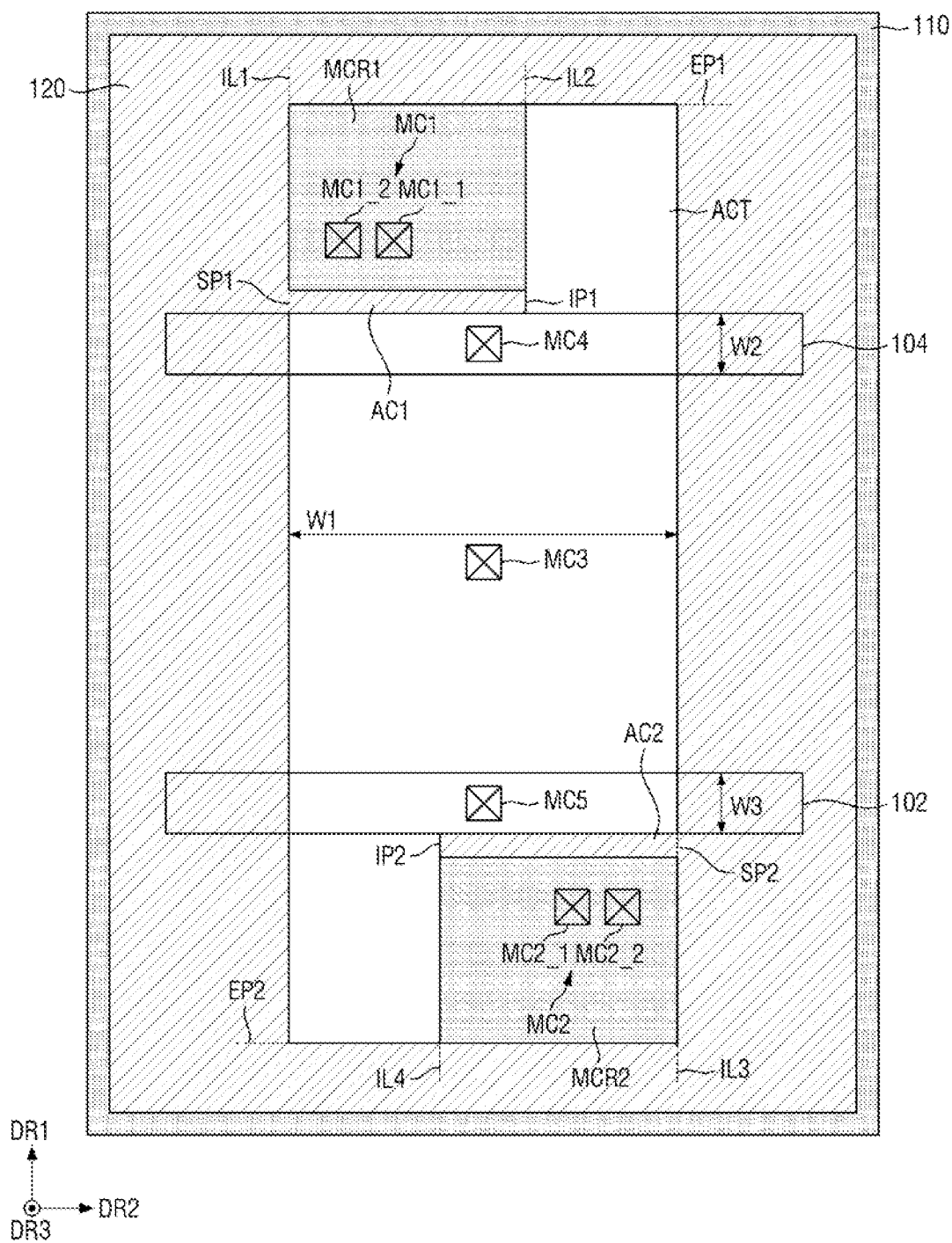
FIGS. 17 and 18 are layout diagrams of a semiconductor device that differs from a metal contact of FIG. 16 according to some embodiments.
Figure 18:
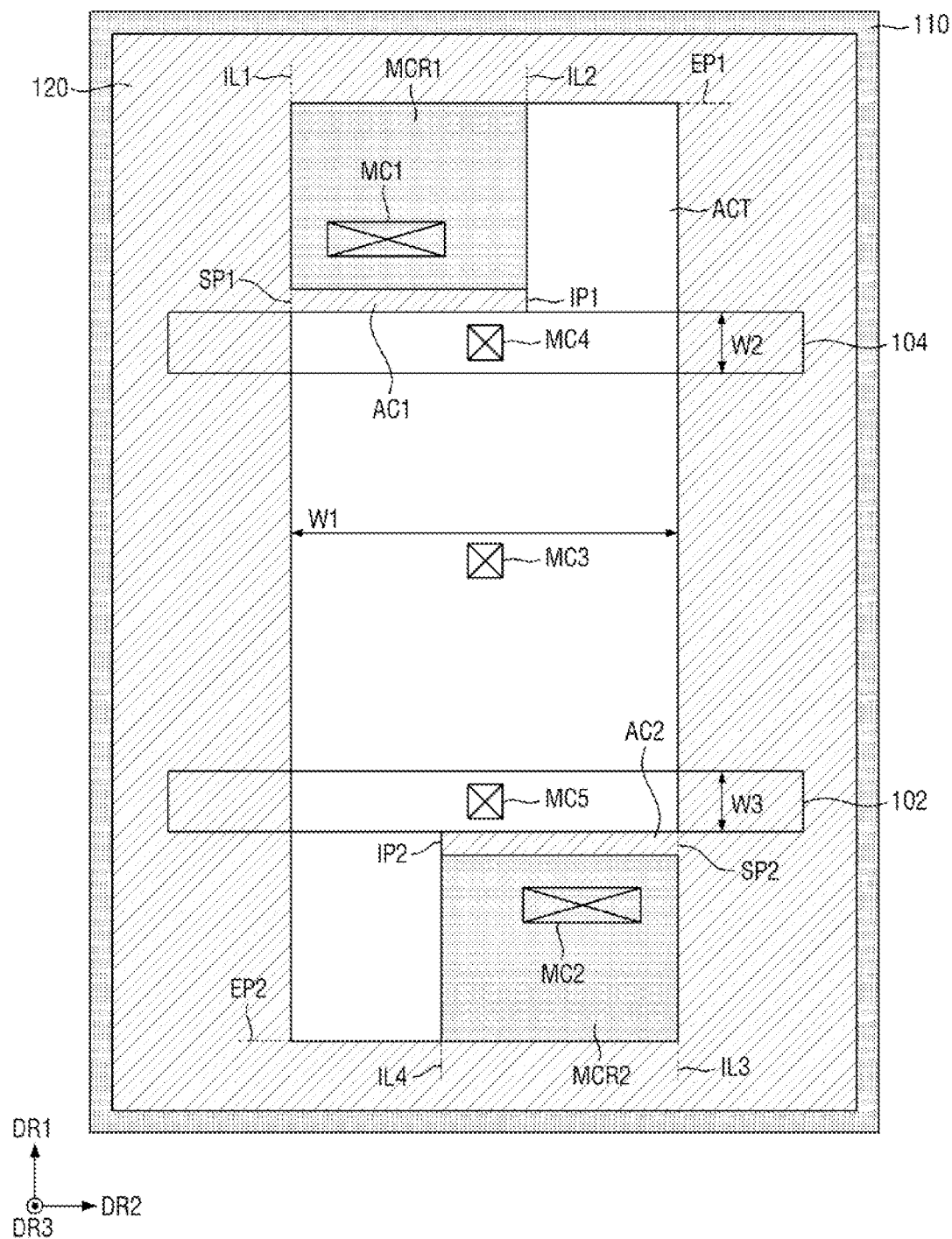

FIGS. 17 and 18 are layout diagrams of a semiconductor device that differs from a semiconductor device of FIG. 16 according to some embodiments.

Referring to FIGS. 17 and 18, according to some embodiments, semiconductor devices of FIGS. 17 and 18 include a metal contact whose form differs from a metal contact of a semiconductor device of FIG. 16.

Since the various forms of metal contacts shown in FIGS. 17 and 18 are substantially the same as those described with reference to FIGS. 10 and 11, a repeated description thereof will be omitted.

FIGS. 19 to 25 are layout diagrams of a semiconductor device according to some embodiments.

Figure 19:
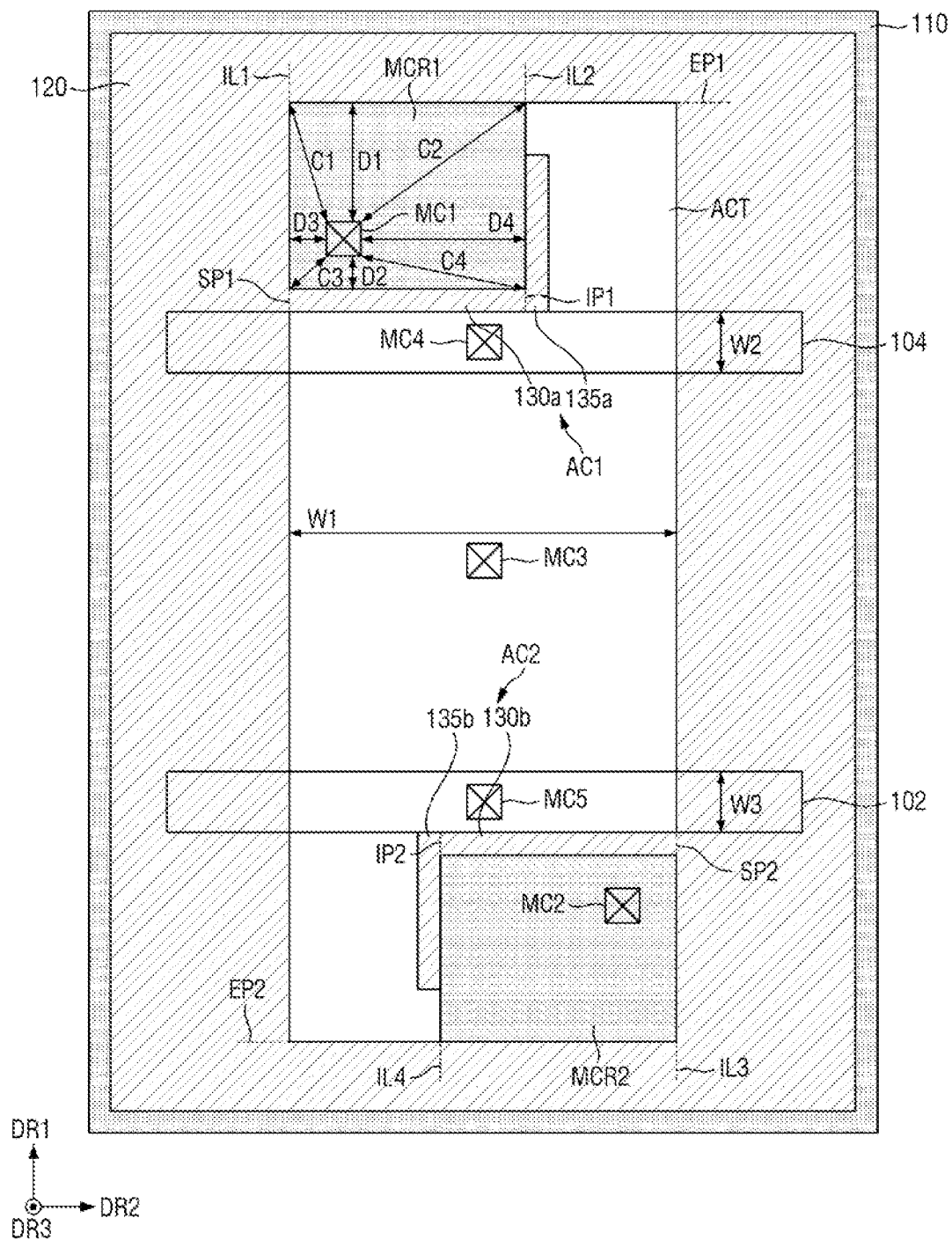
FIGS. 19 to 25 are layout diagrams of another semiconductor device according to some embodiments.

Referring to FIG. 19, according to some embodiments, unlike a semiconductor device of FIG. 16, the first active cut AC1 includes a first extension 130a and a first protrusion 135a. That is, the first extension 130a is the same as the first active cut AC1 of FIG. 16, and a semiconductor device of FIG. 19 further includes the first protrusion 135a.

In a semiconductor device of FIG. 19 according to some embodiments, by further including the first protrusion 135a, an electrical movement distance between the first metal contact MC1 and the gate structure 100 further increases, and the breakdown voltage of a semiconductor device of FIG. 19 further increases accordingly.

Further, according to some embodiments, unlike a semiconductor device of FIG. 16, in a semiconductor device of FIG. 19, the second active cut AC2 includes a second extension 130b and a second protrusion 135b. That is, the second extension 130b is the same as the second active cut AC2 of FIG. 16, and a semiconductor device of FIG. 19 further includes the second protrusion 135b.

According to some embodiments, in a semiconductor device of FIG. 19, by further including the second protrusion 135b, the electrical movement distance between the second metal contact MC2 and the gate structure 100 further increases, and the breakdown voltage of a semiconductor device of FIG. 19 further increases accordingly.

Figure 20:
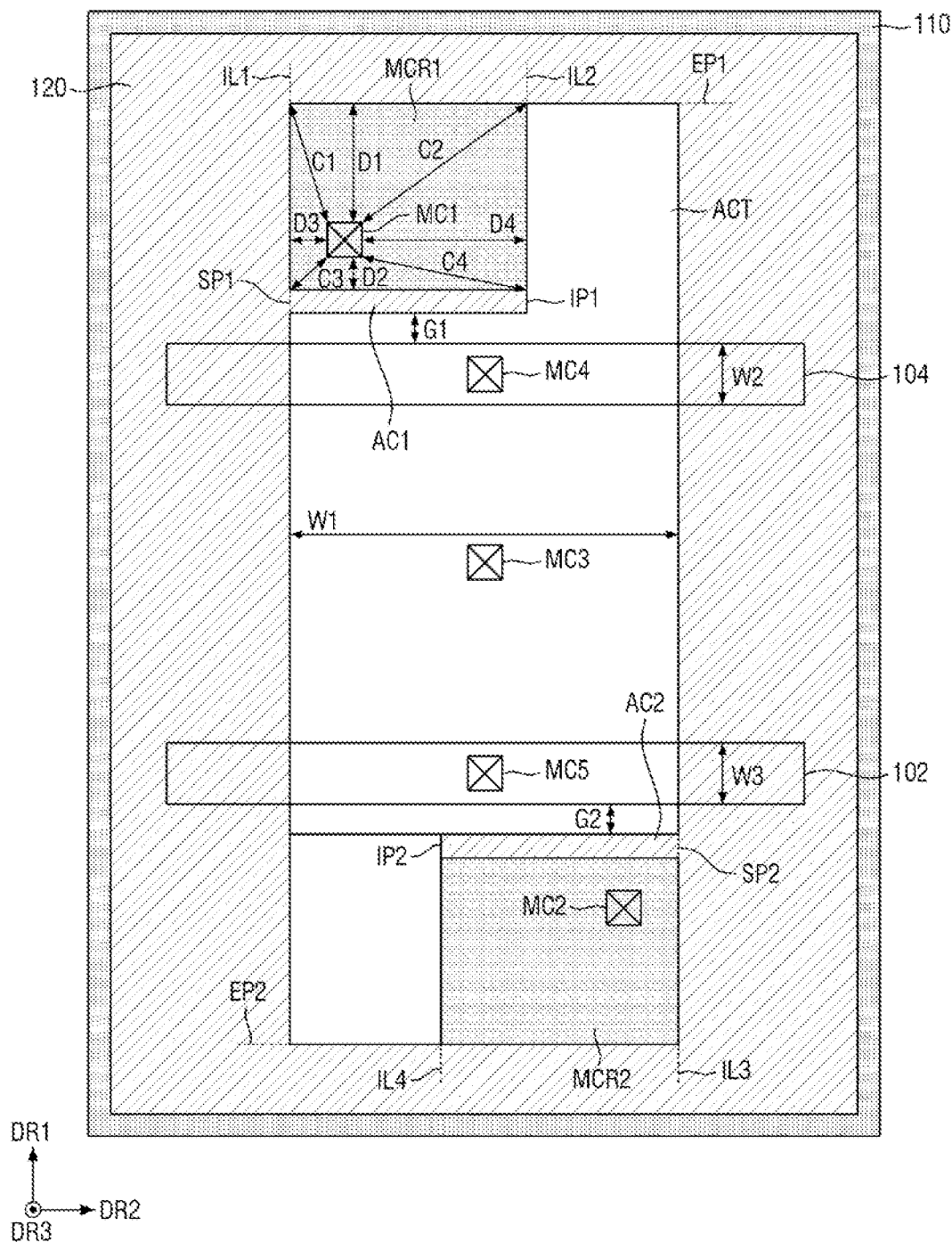

Referring to FIG. 20, according to some embodiments, unlike a semiconductor device of FIG. 16, the first active cut AC1 is spaced apart in the first direction DR1 from the gate structure 100 by a first gap G1.

That is, according to spine embodiments in a semiconductor device of FIG. 20, since the first active cut AC1 is spaced apart in the first direction DR1 from the gate structure 100 by the first gap G1, the electrical movement distance between the first metal contact MC1 and the gate structure 100 further increases, and the breakdown voltage of a semiconductor device of FIG. 20 further increases accordingly.

Further, according to some embodiments, unlike a semiconductor device of FIG. 16, in a semiconductor device of FIG. 20, the second active cut AC2 is spaced apart in the first direction DR1 from the gate structure 100 by a second gap G2.

That is, according to some embodiments, in a semiconductor device of FIG. 20, since the second active cut AC2 is spaced apart in the first direction DR1 from the gate structure 100 by the second gap G2, the electrical movement distance between the second metal contact MC2 and the gate structure 100 further increases, and the breakdown voltage of a semiconductor device of FIG. 20 increases accordingly.

Figure 21:
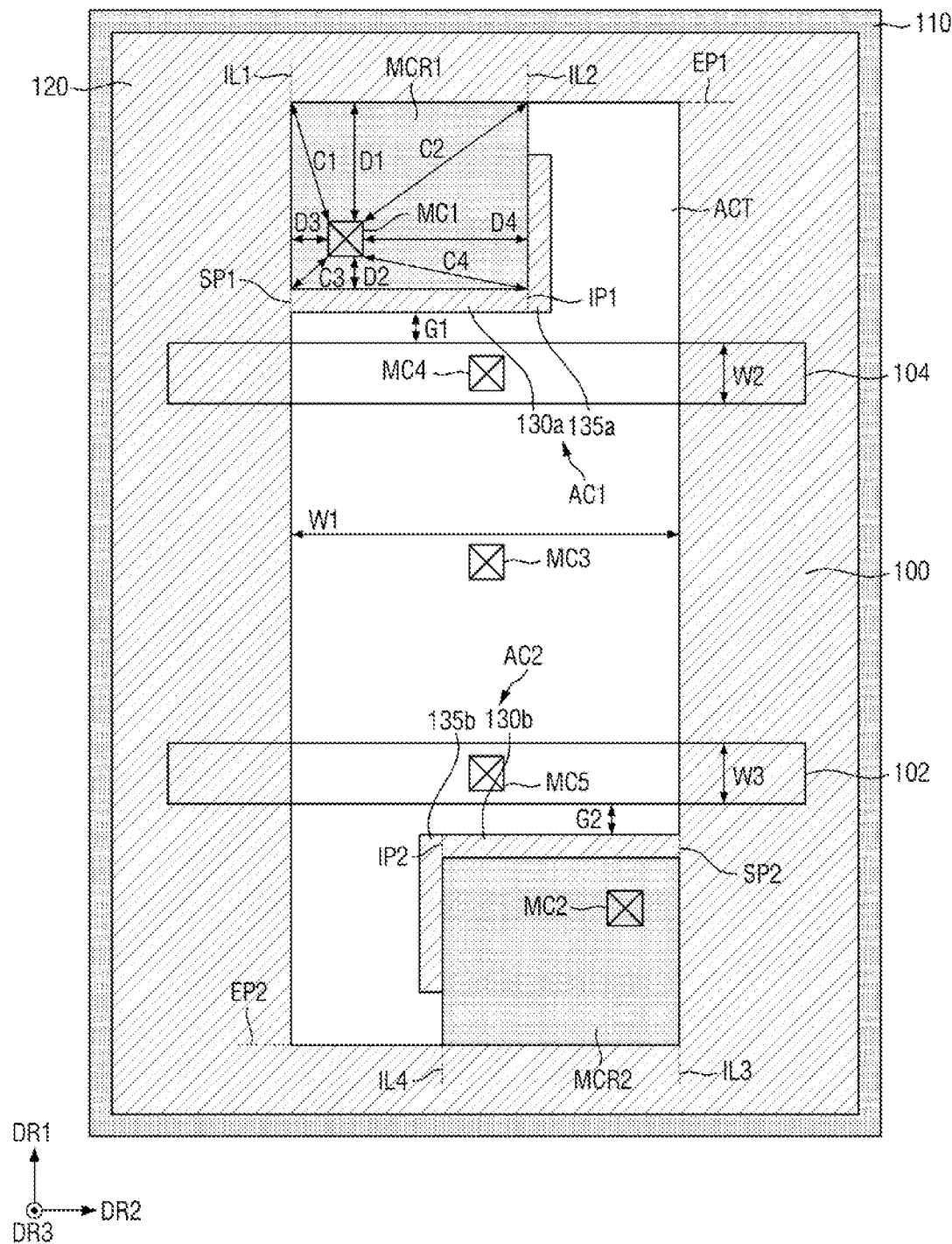

Referring to FIG. 21, according to some embodiments, unlike a semiconductor device of FIG. 16, the first active cut AC1 is spaced apart in the first direction DR1 from the gate structure 300 by a first gap G1.

That is, according to some embodiments, in a semiconductor device of FIG. 21, since the first active cut AC1 is spaced apart in the first direction DR1 from the gate structure 100 by the first gap G1, the electrical movement distance between the first metal contact MC1 and the gate structure 100 further increases, and the breakdown voltage of a semiconductor device of FIG. 21 increases accordingly.

Further, according to some embodiments, unlike a semiconductor device of FIG. 16, in a semiconductor device of FIG. 21, the second active cut AC2 is spaced apart in the first direction DR1 from the gate structure 100 by a second gap G2.

That is, according to some embodiments, in a semiconductor device of FIG. 21, since the second active cut AC2 is spaced apart in the first direction DR1 from the gate structure 100 by the second gap G2, the electrical movement distance between the second metal contact MC2 and the gate structure 100 further increases, and the breakdown voltage of a semiconductor device of FIG. 21 increases accordingly.

Figure 22:
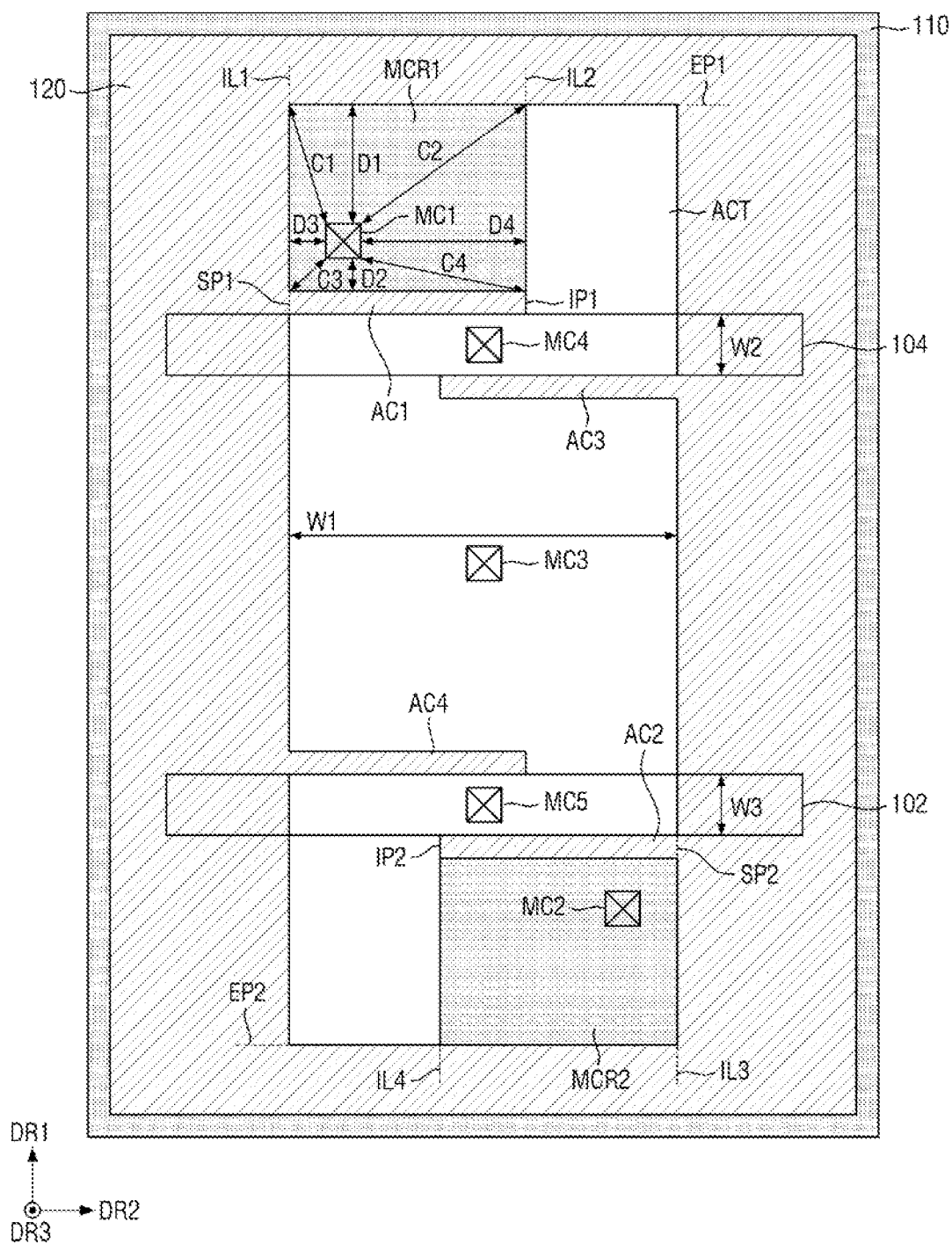

Referring to FIG. 22, according to some embodiments, unlike a semiconductor device of FIG. 16, a semiconductor device of FIG. 22 further includes a third active cut AC3 and a fourth active cut AC4 between the first gate electrode 102 and the second gate electrode 104.

In detail, according to some embodiments, the fourth active cut AC4 is formed on a side of the first gate electrode 102 that faces the side of the first gate electrode 102 on which the second active cut AC2 is formed. In other words, while the second active cut AC2 extends from the third virtual line IL3 the second direction DR2 into the active region toward the termination point IP2, the fourth active cut SC4 extends from the first virtual line IL1 in the opposite second direction DR2 into the active region. Further, the third active cut AC3 is formed on a side of the second gate electrode 104 that faces a side of the second gate electrode 104 on which the first active cut AC1 is formed. In other words, while the first active cut AC1 extends from the first virtual line IL1 in the second direction DR2 into the active region toward the termination point IP1, the third active cut SC3 extends from the third virtual line IL3 in the opposite second direction DR2 into the active region.

That is, according to some embodiments, in a semiconductor device of FIG. 22, by placing the third active cut AC3, the electrical movement distance between the third metal contact MC3 and the second gate structure 100 further increase, and the breakdown voltage of a semiconductor device of FIG. 22 increases accordingly. Further, in a semiconductor device of FIG. 22, by placing the fourth active cut AC4, the electrical movement distance between the third metal contact MC3 and the first gate structure 100 further increases, and the breakdown voltage of a semiconductor device of FIG. 22 increases accordingly.

Figure 23:
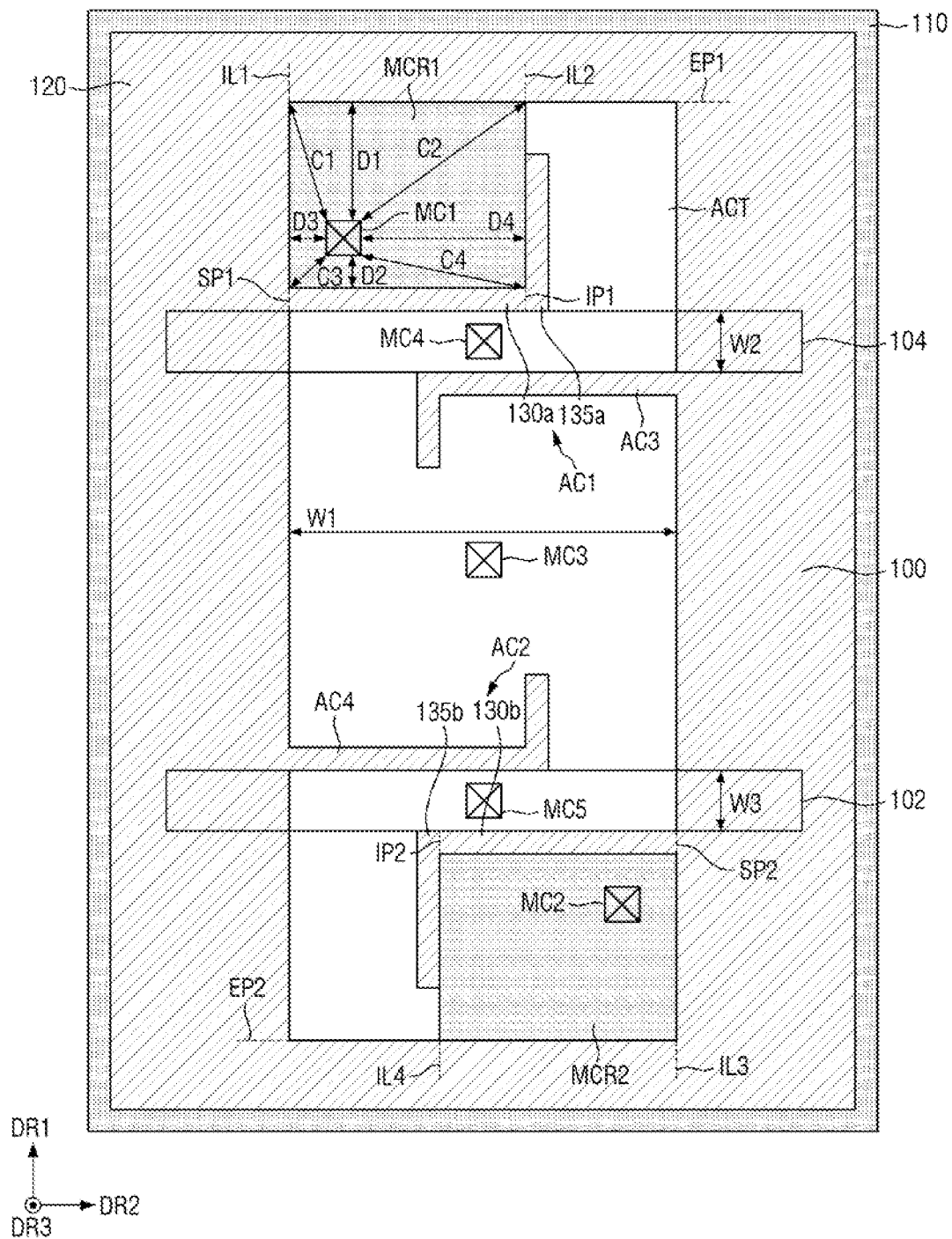

Referring to FIG. 23, according to some embodiments, unlike a semiconductor device of FIG. 19, a semiconductor device of FIG. 23 further includes a third active cut AC3 and a fourth active cut AC4 between the first gate electrode 102 and the second gate electrode 104.

In detail, according to sonic embodiments, the fourth active cut AC4 is formed on a side of the first gate electrode 102 that faces the side of the first gate electrode 102 on which the second active cut AC2 is formed. Further, the third active cut AC3 is formed on a side of the second gate electrode 104 that faces the side of the second gate electrode 104 on which the first active cut AC1 is formed.

According to some embodiments, each of the third active cut AC3 and the fourth active cut AC4 includes an extension and a protrusion.

That is, according to some embodiments, in a semiconductor device of FIG. 23, by placing the third active cut AC3, which includes the extension and the protrusion, the electrical movement distance between the third metal contact MC3 and the second gate structure 100 further increases, and the breakdown voltage of a semiconductor device of FIG. 23 increases accordingly. Further, in a semiconductor device of FIG. 23, by placing the fourth active cut AC4, which includes the extension and the protrusion, the electrical movement distance between the third metal contact MC3 and the first the gate structure 100 further increases, and the breakdown voltage of a semiconductor device of FIG. 23 increases accordingly.

Figure 24:
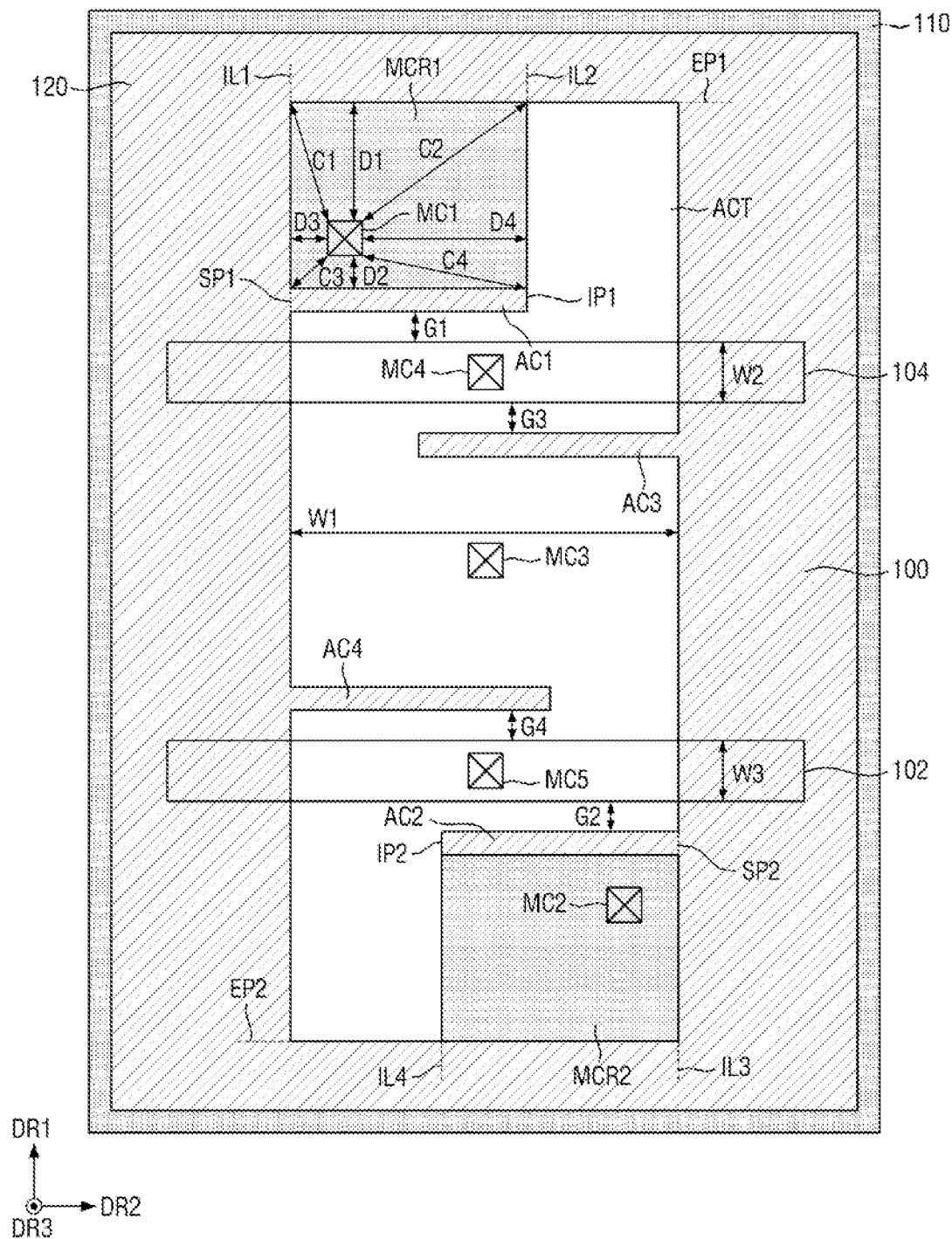

Referring to FIG. 24, according to some embodiments, unlike a semiconductor device of FIG. 20, a semiconductor device of FIG. 24 further includes a third active cut AC3 and a fourth active cut AC4 between the first gate electrode 102 and the second gate electrode 104.

In detail, according to sonic embodiments, the fourth active cut AC4 is formed on a side of the first gate electrode 102 that faces a side of the first gate electrode 102 on which the second active cut AC2 is formed. Further, the third active cut AC3 is formed on a side of the second gate electrode 104 that faces a side of the second gate electrode 104 on which the first active cut AC1 is formed.

According to some embodiments, the third active cut AC3 is spaced apart in the first direction DR1 from the second gate electrode 104 by the third gap G3, and the fourth active cut AC4 is spaced apart in the first direction DR1 from the first gate electrode 102 by the fourth gap G4. The widths of each of the first gap G1 to the fourth gap G4 may be the same as or different from each other.

That is, according to some embodiments, in a semiconductor device of FIG. 24, since the third active cut AC3 is spaced apart from the second gate electrode 104 by the third gap G3, the electrical movement distance between the third metal contact MC3 and the second gate structure 100 further increases, and the breakdown voltage of a semiconductor device of FIG. 24 increases accordingly. Further, in a semiconductor device of FIG. 24, since the fourth active cut AC4 is spaced apart from the first gate electrode 102 by the fourth gap G4, the electrical movement distance between the third metal contact MC3 and the first gate structure 100 further increases, and the breakdown voltage of a semiconductor device of FIG. 24 increases accordingly.

Figure 25:
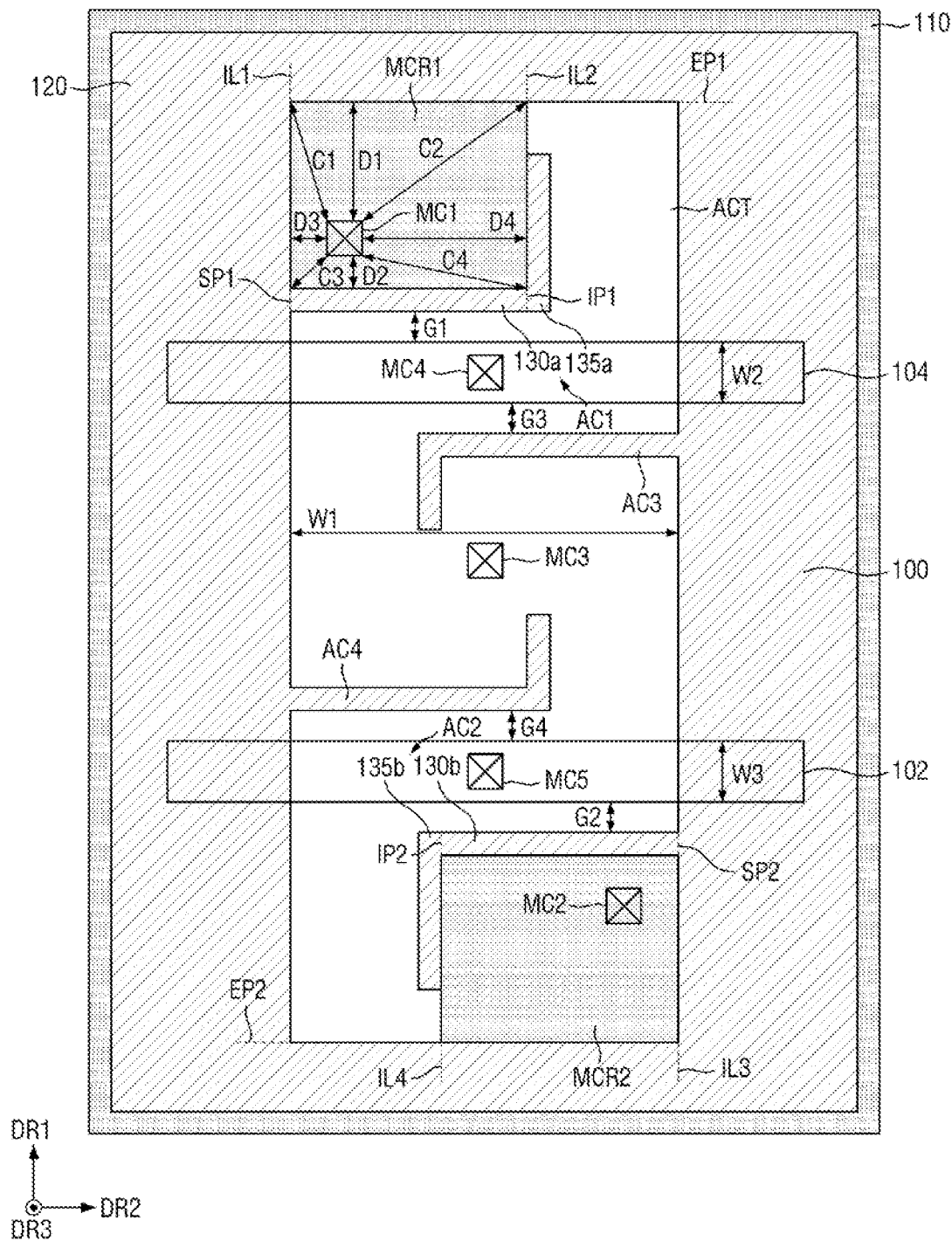

Referring to FIG. 25, according to some embodiments, unlike a semiconductor device of FIG. 21, a semiconductor device of FIG. 25 further includes a third active cut AC3 and a fourth active cut AC4 between the first gate electrode 102 and the second gate electrode 104.

In detail, according to some embodiments, the fourth active cut AC4 is formed on a side of the first gate electrode 102 that faces a side of the first gate electrode 102 on which the second active cut AC2 is formed. Further, the third active cut AC3 is formed on a side of the second gate electrode 104 that faces a side of the second gate electrode 104 on which the first active cut AC1 is formed.

According to some embodiments, the third active cut AC3 includes an extension and a protrusion, and is spaced apart in the first direction DR1 from the second gate electrode 104 by a third gap G3. In addition, the fourth active cut AC4 includes an extension and a protrusion, and is spaced apart in the first direction from the first gate electrode 102 by a fourth gap G4. Widths of each of the first gap G1 to the fourth gap G4 may be the same as or different from each other.

That is, according to some embodiments, in a semiconductor device of FIG. 25, since the third active cut AC3 is spaced apart from the second gate electrode 104 by the third gap G3 and includes the extension and the protrusion, the electrical movement distance between the third metal contact MC3 and the second gate structure 100 further increases, and the breakdown voltage of a semiconductor device of FIG. 25 increases accordingly. In addition, in a semiconductor device of FIG. 25, since the fourth active cut AC4 is spaced apart from the first gate electrode 102 by the fourth gap G4 and includes the extension and the protrusion, the electrical movement distance between the third metal contact MC3 and the first gate structure 100 further increases, and the breakdown voltage of a semiconductor device of FIG. 25 increases accordingly.

Figure 26:
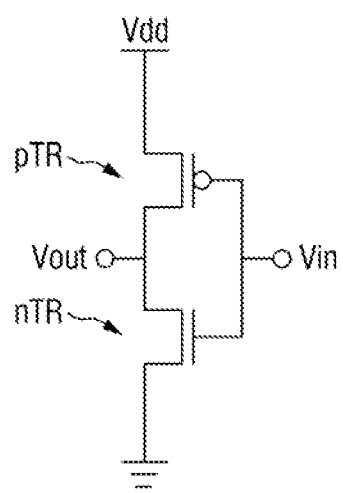
FIG. 26 is a circuit diagram of another semiconductor device according to some embodiments.

FIG. 26 is a circuit diagram of an semiconductor device according to some embodiments.

Referring to FIG. 26, according to same embodiments, ar semiconductor devices 3 includes an n-type transistor nTR and a p-type transistor pTR. For example, the semiconductor device 3 may include a plurality of transistors pTR and nTR that constitute an inverter.

According to some embodiments, a source of the n-type transistor nTR is connected to a ground voltage, a drain thereof is connected to a drain of the p-type transistor pTR, and a gate thereof is connected to a gate of the p-type transistor pTR to receive an input voltage Vin.

In addition, according to some embodiments, a source of the p-type transistor pTR is connected to a power supply voltage Vdd, a drain thereof is connected to a drain of the n-type transistor nTR, and a gate thereof is connected to the n-type transistor nTR to receive the input voltage Vin.

According to some embodiments, the input voltage Vin received through the gates of the n-type transistor nTR and the p-type transistor pTR is inverted, and an output voltage Vout is generated at a node where the drain of the n-type transistor nTR and the drain of the p-type transistor pTR are connected. That is, the output voltage Vout is an inverted signal of the input voltage Vin.

According to some embodiments, the breakdown voltage is reduced by miniaturization of the n-type transistor nTR and the p-type transistor pTR, which utilize a high voltage. Therefore, by increasing the electrical distance between the metal contacts, such as a drain end of the n-type transistor nTR, a source end of the n-type transistor nTR, a drain end of the p-type transistor pTR, or a source end of the p-type transistor pTR, and the gate, it is possible to increase the breakdown voltage of the n-type transistor nTR and the p-type transistor pTR that utilize high voltage.

According to some embodiments, a structure that increases the electrical distance between the metal contacts, such as the drain end of the n-type transistor nTR or the source end of the n-type transistor nTR, of the n-type transistor nTR in the semiconductor device 3 and a gate will be described in detail with reference to FIG. 27. Further, a structure which increases the electrical distance between the metal contacts such as the drain end of the p-type transistor pTR or the source end of the p-type transistor pTR, of the p-type transistor pTR in the semiconductor device 3 and the gate will be described in detail with reference FIG. 27. However, a repeated description of previously described components will be omitted.

Figure 27:
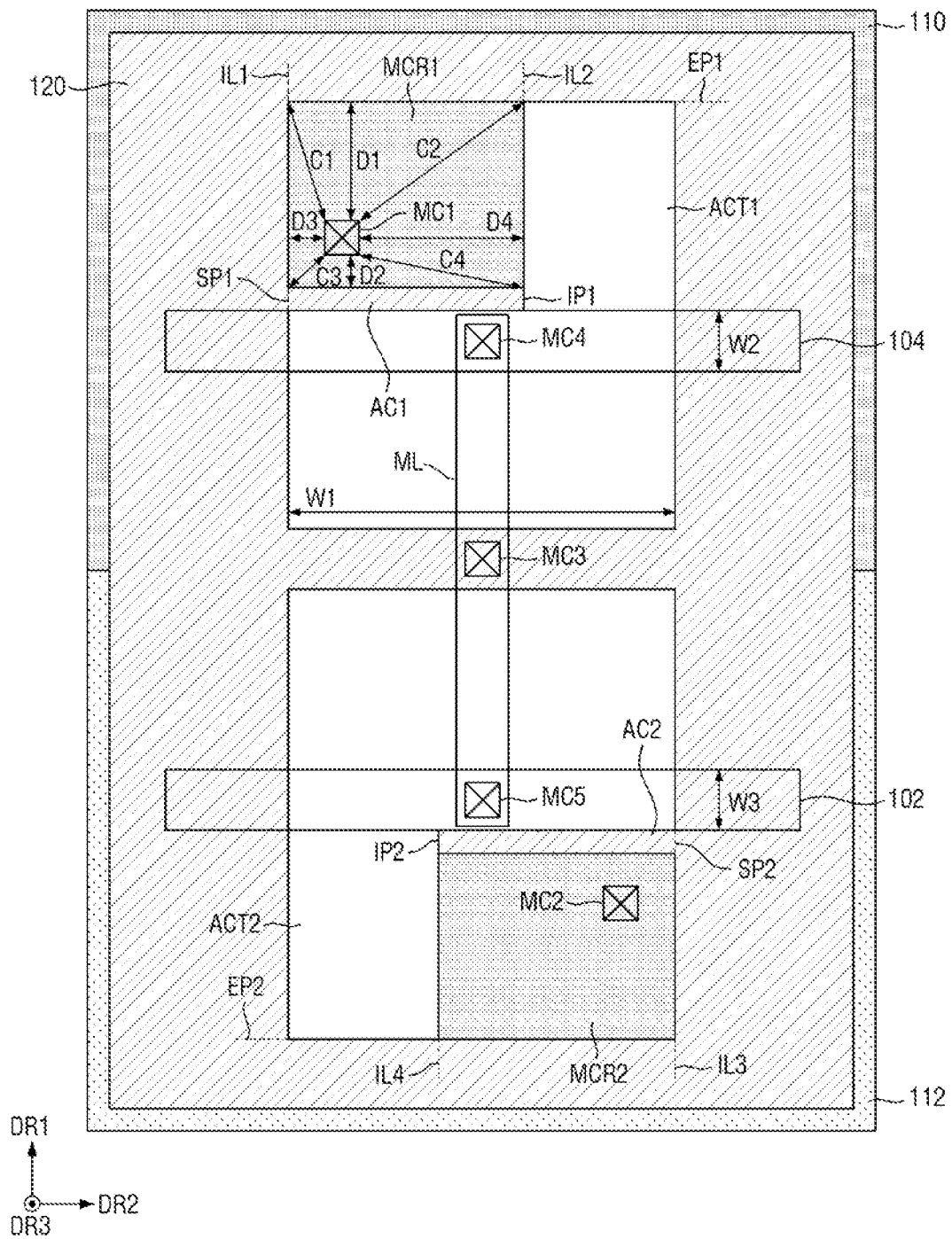
FIG. 27 is a layout diagram of a semiconductor device of FIG. 26 according to some embodiments.

FIG. 27 is a layout diagram of a semiconductor device of FIG. 26 according to some embodiments.

Referring to FIGS. 26 and 27, according to some embodiments, unlike a semiconductor device of FIG. 16, a semiconductor device of FIG. 27 further includes a metal line ML. The metal line ML extends in the first direction DR1 and electrically connects the fourth metal contact MC4 and the fifth metal contact MC5. In addition, a metal contact that extends in the third direction DR3 is formed on the metal line ML to receive an external voltage, such as an input voltage Vin.

In addition, according to some embodiments, unlike a semiconductor device of FIG. 16, a semiconductor device of FIG. 27 includes active regions that differ from each other. That is, a first active region ACT1 is formed in which an n-type transistor is formed, and a second active region ACT2 is formed in which a p-type transistor is formed.

In detail, according to some embodiments, the first active region ACT1 in which the n-type transistor nTR is formed forms a p-well on the substrate, and the second active region ACT2 in which the p-type transistor pTR is formed forms an n-well on the substrate. The first active region ACT1 is separated from the second active region ACT2 in the first direction by the shallow trench isolation region 120, a portion of which extends in the second direction between first active region ACT1 and the second active region ACT2.

That is, according to some embodiments, the first metal contact MC1 is connected to the ground voltage, and the fourth metal contact MC4 receives the input voltage Vin through the metal line ML and is connected to the p-type transistor pTR through the third metal contact MC3. Further, the second metal contact MC2 is connected to the power supply voltage Vdd, and the fifth metal contact MC5 receives the input voltage Vin through the metal line ML and is connected to the n-type transistor nTR through the third metal contact MC3.

According to some embodiments, a triad, such as boron, is injected into the field region 110 that surrounds the first active region ACT1 to form the p-well, and a pentad, such as phosphorus, is injected into a field region 112 that surrounds the second active region ACT2 to form the n-well.

Figure 28:
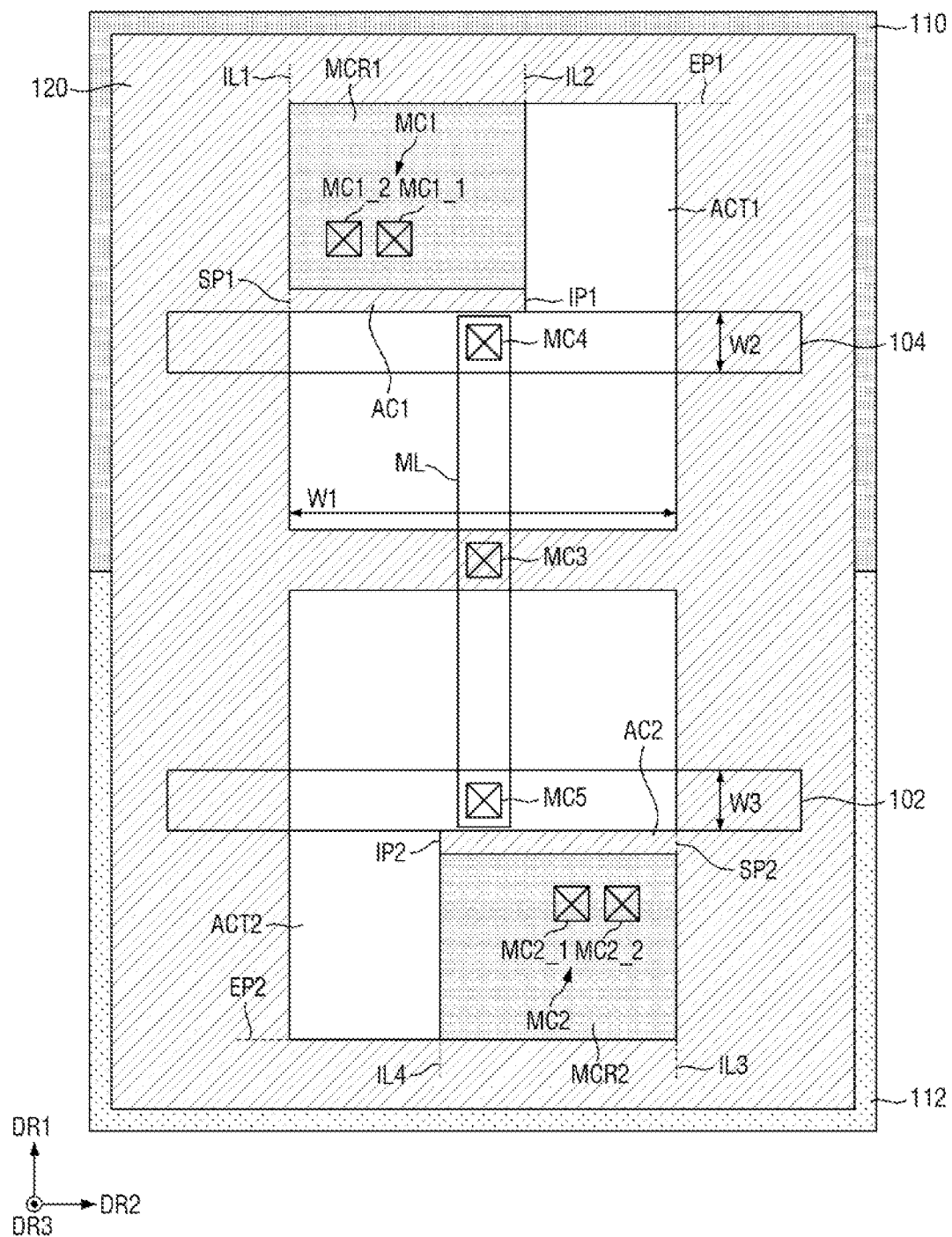
FIGS. 28 and 29 are layout diagrams of a semiconductor device that differs from a metal contact of FIG. 27 according, to some embodiments.
Figure 29:
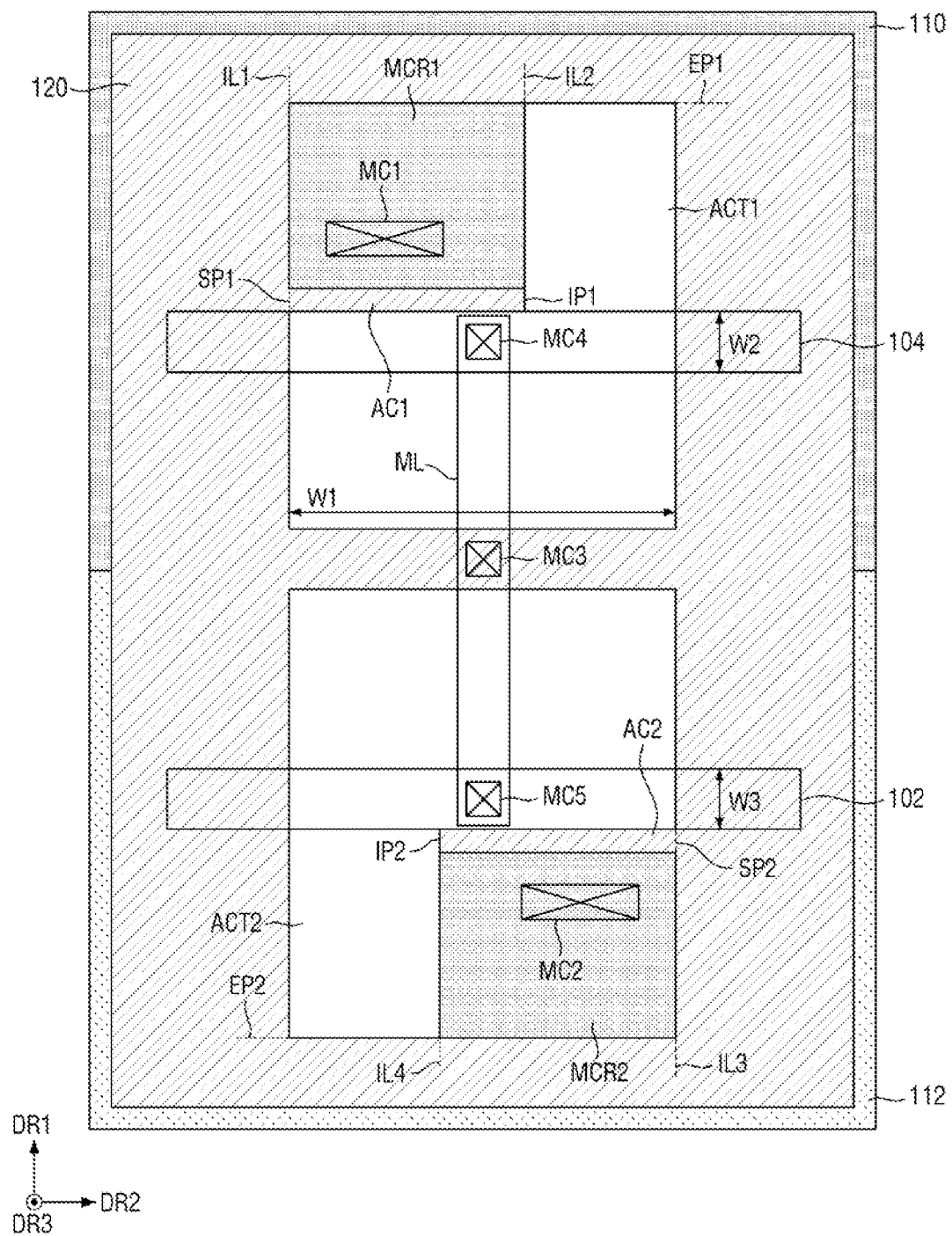

FIGS. 28 and 29 are layout diagrams of a semiconductor device that differs from a semiconductor device of FIG. 27, according to some embodiments.

Referring to FIGS. 28 and 29, according to some embodiments, a semiconductor device of FIGS. 28 and 29 includes a metal contact of a form that differs from the metal contact of a semiconductor device of FIG. 16.

Since a description of various forms of metal contacts would be the same as those described with reference to FIGS. 10 and 11, a duplicate description thereof will be omitted.

FIGS. 30 to 36 are layout diagrams of an semiconductor device according to some embodiments.

Referring to FIGS. 30 to 36, according to some embodiments, since a structure of a semiconductor device of FIGS. 30 to 36 is similar to those of semiconductor devices of FIGS. 19 to 25, except that a first active ACT1 and a second active region are included, a field region is made up of different field regions 110 and 112, and a metal line ML is included, a repeated description thereof will be omitted.

In concluding the detailed description, those skilled in the art will appreciate that many variations and modifications may be made to embodiments without substantially departing from the principles of the present inventive concept. Therefore, disclosed embodiments of the disclosure are used in a generic and descriptive sense only and not for purposes of limitation.

What is claimed is:

1. A semiconductor device, comprising:
an active region that extends in a first direction;
a first gate structure extending in a second direction intersecting the first direction, disposed on the active region, and including first and second sides that oppose each other in the first direction;
first and second metal contacts spaced apart from each of the first and second sides of the first gate structure in the first direction;
a first trench disposed in the active region, and extending in the second direction between the first side of the first gate structure and the first metal contact;
a second trench disposed in the active region and extending in an opposite second direction between the second side of the first gate structure and the second metal contact; and
an insulating material disposed to surround the active region, and also disposed in the first trench to be as a first active cut having a starting point and a termination point spaced from the starting point along the second direction inside the active region,
wherein the first active cut defines a first metal region in the active region in which the first metal contact is located,
in a plan view of the semiconductor device, the first metal region extends from a first virtual line that extends from the starting point of the first active cut along the first direction, the first metal region extends from a second virtual line that extends from the termination point of the first active cut along the first direction, and the first metal region extends from the first active cut, and
a first distance from the first metal contact to the first virtual line is less than a second distance from the first metal contact to the second virtual line,
a length along the first direction of a region in which the first gate structure and the active region overlap is greater than lengths of the first and second trenches extending in the first direction, and
the first active cut is placed between the first metal contact and the first gate structure in the first direction.

2. The semiconductor device of claim 1, wherein the first active cut is spaced apart from the first gate structure in the first direction by a first gap.

3. The semiconductor device of claim 1, wherein the first metal contact has a bar shape.

4. The semiconductor device of claim 1, wherein the first metal contact includes two contacts.

5. The semiconductor device of claim 1, wherein the first active cut includes a protrusion that extends in the first direction, and an extension that extends in the second direction.

6. The semiconductor device of claim 5, wherein the first metal contact is located between the protrusion and the extension.

7. The semiconductor device of claim 1, wherein the insulating material is also disposed in the second trench to be as a second active cut, and
the first gate structure is placed between the first active cut and the second active cut.

8. The semiconductor device of claim 7, wherein the second metal contact is spaced apart from the second active cut in the first direction, and
the second active cut defines a second metal region inside the active region, and the second metal contact is placed off-center inside the second metal region.

9. The semiconductor device of claim 7, wherein the second active cut includes a protrusion that extends in the first direction, and an extension that extends in the second direction.

10. The semiconductor device of claim 1, further comprising:
a second gate structure disposed on the active region and that extends in the second direction and is spaced apart from the first gate structure in the first direction; and
a second trench disposed in the active region,
wherein the second metal contact is spaced apart from the second gate structure in the first direction,
the insulating material is also disposed in the second trench to be as a second active cut, and
the second active cut defines a second metal region in the active region in which the second metal contact is located, and the second metal contact is placed off-center in the second metal region.

11. The semiconductor device of claim 1, wherein the first side of the first gate structure forms a sidewall of the first trench, and the second side of the first gate structure forms a sidewall of the second trench.

12. A semiconductor device comprising:
an active region that extends in a first direction and a second direction that intersects the first direction;
a first gate structure disposed on the active region and that extends in the second direction;
a first active cut on a first side of the first gate structure and that begins at a first side of the active region and extends in the second direction from the first side of the active region into the active region and ends at a third side of the active region;
a second active cut on a second side of the first gate structure opposite to the first side of the first gate structure and that begins at a second side of the active region and extends in an opposite second direction into the active region from the second side of the active region that is opposite to the first side of the active region and ends at a fourth side of the active region,
wherein each of the first active cut and the second active cut includes a trench filled with an insulating material;
a first metal contact spaced apart from the first active cut in the first direction such that the first active cut is disposed between the first metal contact and the first gate structure, and a second metal contact spaced apart from the second active cut in the first direction such that the second active cut is disposed between the second metal contact and the first gate structure, wherein a first distance from the first metal contact to the first active cut differs from a second distance from the first metal contact to an end of the active region that is opposite to the first active cut, the first metal contact is closer to the first side of the active region than the second side of the active region, and the second metal contact is closer to the second side of the active region than the first side of the active region, and the first metal contact is closer to the first side of the active region than the third side of the active region, and the second metal contact is closer to the second side of the active region than the fourth side of the active region.

13. The semiconductor device of claim 12, wherein the first distance is less than the second distance.

14. The semiconductor device of claim 12, further comprising:
a first metal region, which, in a plan view of the semiconductor device, covers the first metal contact, extends from the first side of the active region, and is spaced apart from the second side of the active region; and
a second metal region, which, in the plan view of the semiconductor device, covers the second metal contact, extends from the second side of the active region, and is spaced apart from the first side of the active region.

15. The semiconductor device of claim 12, wherein the first metal contact includes two contacts.

16. A semiconductor device, comprising:
an active region extending in a first direction and a second direction that intersects the first direction;
a first gate structure extending in the second direction, disposed on the active region, and including first and second sides that oppose each other in the first direction;
first and second metal contacts spaced apart from each of the first and second sides of the first gate structure in the first direction;

a first active cut on the first side of the first gate structure and that begins at a first side of the active region and extends in the second direction from the first side of the active region into the active region and ends at a third side of the active region; and a second active cut on the second side of the first gate structure opposite to the first side of the first gate structure and that begins at a second side of the active region and extends in an opposite second direction into the active region from the second side of the active region that is opposite to the first side of the active region and ends at a fourth side of the active region, wherein each of the first active cut and the second active cut includes a trench filled with an insulating material, wherein the first active cut defines a first metal region in the active region in which the first metal contact is disposed, such that, in a plan view of the semiconductor device, the first active cut is disposed between the first metal region and the first gate structure, the second active cut defines a second metal region in the active region in which the first metal contact is disposed, such that, in the plan view of the semiconductor device, the second active cut is disposed between the second metal region and the first gate structure, in the plan view of the semiconductor device, the first metal region covers the first metal contact, extends from the first side of the active region, and is spaced apart from the second side of the active region, in the plan view of the semiconductor device, the second metal region covers the second metal contact, extends from the second side of the active region, and is spaced apart from the first side of the active region, and the first metal contact is closer to the first side of the active region than the third side of the active region, and the second metal contact is closer to the second side of the active region than the fourth side of the active region.

17. The semiconductor device of claim 16, wherein the first metal contact includes two contacts.

* * * * *